(12) United States Patent
Jung et al.

(10) Patent No.: US 7,884,362 B2
(45) Date of Patent: Feb. 8, 2011

(54) ARRAY SUBSTRATE FOR LIQUID CRYSTAL DISPLAY DEVICE AND METHOD OF FABRICATING THE SAME

(75) Inventors: Ji-Hyun Jung, Ulsan (KR); Dong-Young Kim, Gyeonsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/808,978

(22) Filed: Jun. 14, 2007

(65) Prior Publication Data
US 2008/0042134 A1   Feb. 21, 2008

(30) Foreign Application Priority Data
Jun. 30, 2006   (KR) .................. 10-2006-0060901

(51) Int. Cl.
*H01L 29/10*   (2006.01)
(52) U.S. Cl. ............. 257/59; 257/57; 257/E21.411; 257/E29.003; 438/158
(58) Field of Classification Search ............ 257/83, 257/57, 59, E21.411, E29.003; 349/43, 46, 349/113, 141; 438/158
See application file for complete search history.

(56) References Cited

U.S. PATENT DOCUMENTS

| 6,236,062 | B1 * | 5/2001 | Nakahori et al. ............ 257/59 |
| 6,274,888 | B1 | 8/2001 | Suzuki et al. |
| 6,476,481 | B2 | 11/2002 | Woodworth et al. |
| 2001/0040662 | A1 * | 11/2001 | Cheng et al. ............ 349/141 |
| 2002/0135710 | A1 * | 9/2002 | Chae ............ 349/43 |
| 2003/0058389 | A1 * | 3/2003 | Ha et al. ............ 349/113 |
| 2003/0178628 | A1 * | 9/2003 | Aoki et al. ............ 257/83 |
| 2006/0076562 | A1 | 4/2006 | Lee et al. |
| 2007/0161136 | A1 * | 7/2007 | Su et al. ............ 438/28 |

FOREIGN PATENT DOCUMENTS

| CN | 1585088 | 2/2005 |
| JP | 07-239478 | 12/1995 |

* cited by examiner

*Primary Examiner*—Bradley K Smith
*Assistant Examiner*—Marvin Payen
(74) *Attorney, Agent, or Firm*—Morgan, Lewis & Bockius LLP

(57) ABSTRACT

An array substrate for a liquid crystal display device includes a gate line and a data line crossing each other on a substrate to define a pixel region, an insulating layer between the gate line and the data line, a gate electrode extending from the gate line, and a transistor in the pixel region having an active layer on the insulating layer, ohmic contact layers of a first material that are adjacent to ends of the active layer, buffer layers of a second material, which is different from the first material, on the ohmic contact layers, a source electrode contacting one of the buffer layers and a drain electrode contacting another one of the buffer layers, wherein the active layer is in an island shape over the gate electrode and within a boundary defined by a perimeter of the gate electrode.

18 Claims, 38 Drawing Sheets

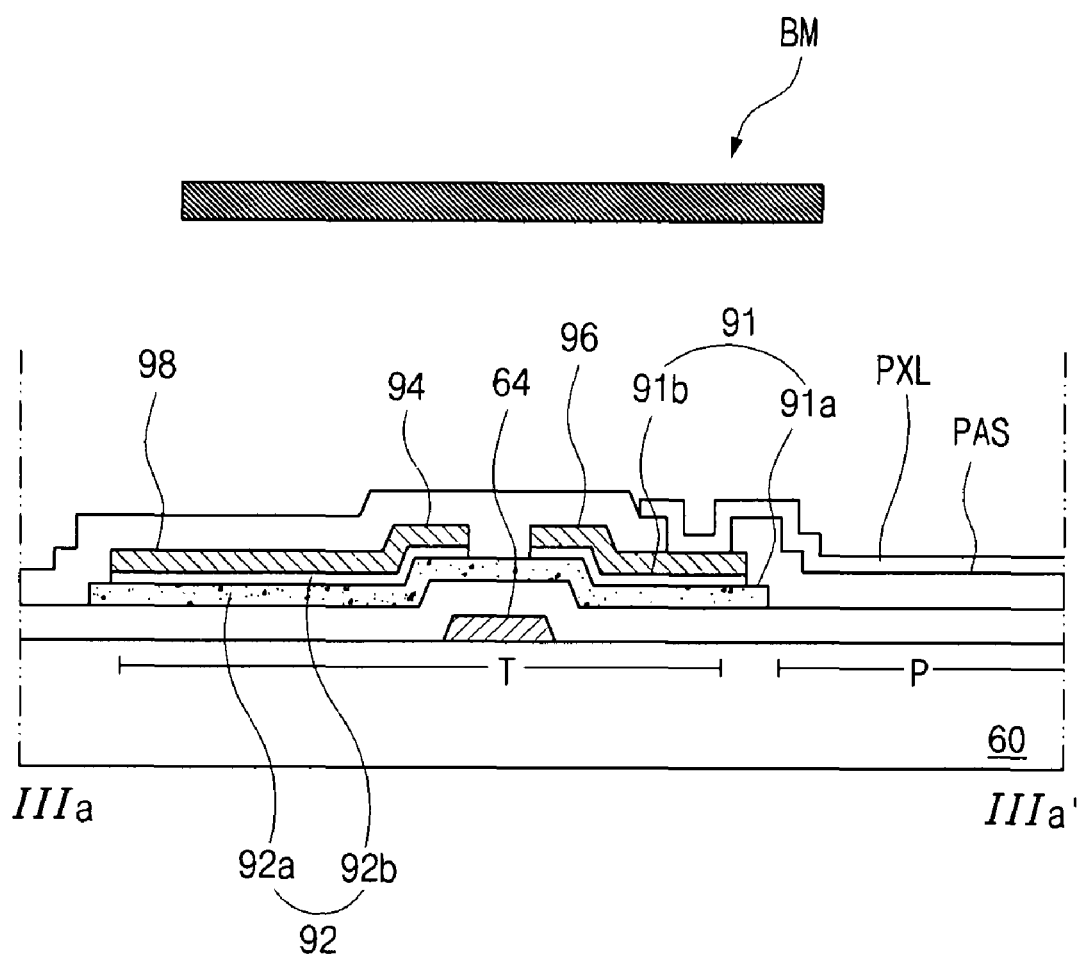

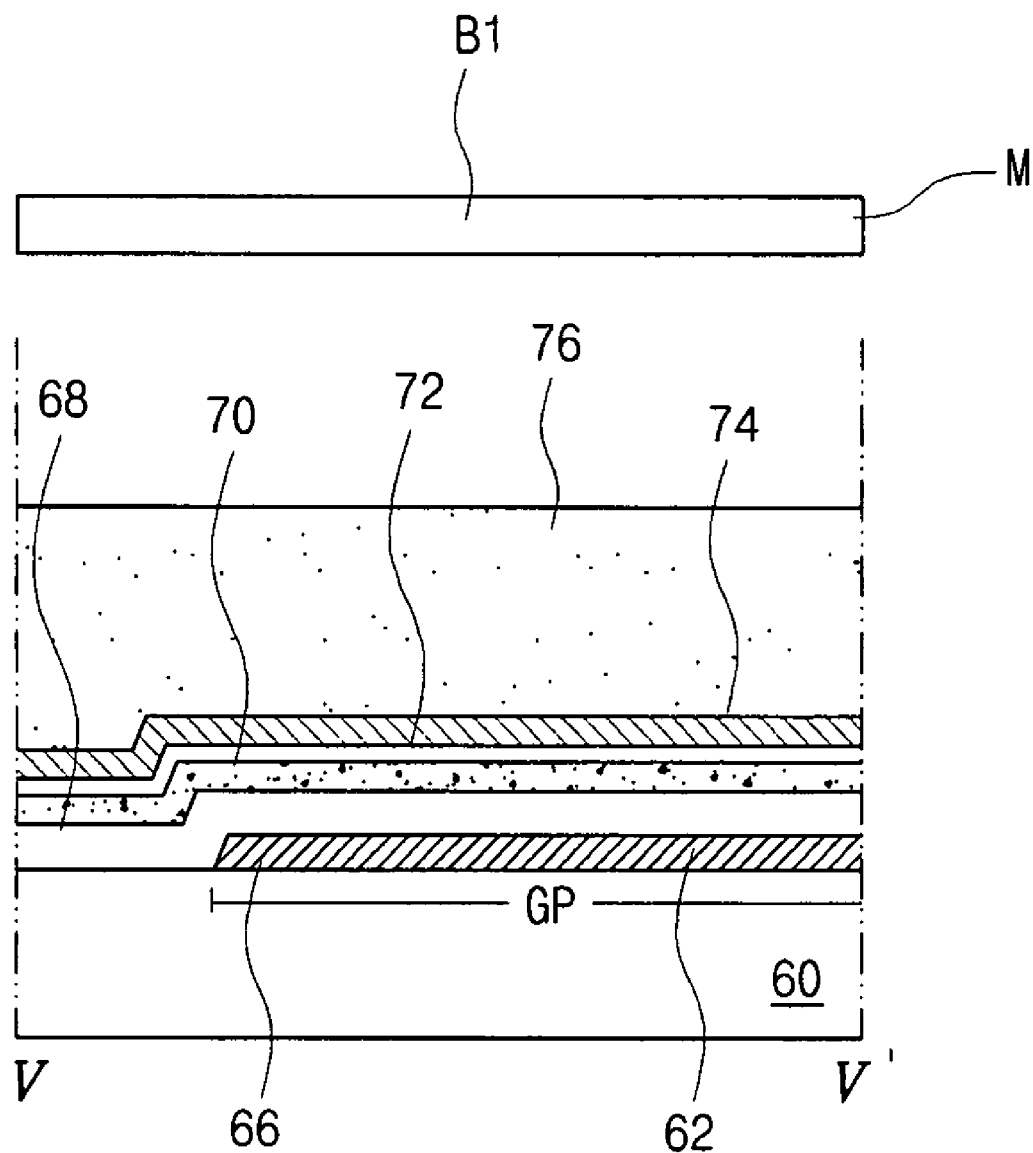

ARRAY SUBSTRATE FOR LIQUID CRYSTAL DISPLAY DEVICE AND METHOD OF FABRICATING THE SAME

The present invention claims the benefit of Korean Patent Application No. 10-2006-0060901, filed in Korea on Jun. 30, 2006, which is hereby incorporated by reference.

BACKGROUND OF THE INVENTION

1. Field of the Invention

The present invention relates to a liquid crystal display device, and more particularly, to an array substrate for a liquid crystal display (LCD) device having an improved aperture ratio and no wavy noise and a method of fabricating the same through a four mask process.

2. Discussion of the Related Art

Liquid crystal display (LCD) devices use the optical anisotropy and polarization properties of liquid crystal molecules to produce an image. The liquid crystal molecules have long, thin, shapes, and have an alignment direction. The alignment direction can be controlled by applying an electric field to influence the alignment of the liquid crystal molecules. Due to an optical anisotropy property of liquid crystal, the refraction of incident light depends on the alignment direction of the liquid crystal molecules. Thus, by properly controlling the applied electric field, an image having a desired brightness can be produced.

The LCD device includes an upper substrate having a common electrode, a lower substrate having a pixel electrode and a liquid crystal layer interposed between the upper and lower substrates. The upper and lower substrates are referred to as color filter and array substrates, respectively. The molecules of the liquid crystal layer are driven by a vertical electric field induced between the common electrode and the pixel electrode.

Among the known types of LCD devices, active matrix LCD (AM-LCD) devices, which have thin film transistors (TFTs) and pixel electrodes arranged in a matrix form, are the subject of significant research and development because of their high resolution and superior ability in displaying moving images.

FIG. 1 is a perspective view showing an LCD device according to the related art. In FIG. 1, the LCD device 51 includes a first substrate 5, a second substrate 10 and a liquid crystal layer (not shown) between the first and second substrates 5 and 10. The first and second substrates 5 and 10 are facing and spaced apart from each other. A black matrix 6 and a color filter layer including red (R), green (G) and blue (B) color filters 7a, 7b and 7c are formed on an inner surface of the first substrate 5 and a common electrode 9 is formed on the color filter layer.

A gate line 14 and a data line 26 are formed on the second substrate 10. The gate line 14 and the data line 26 cross each other to define a pixel region P. A thin film transistor (TFT) T is connected to the gate line 14 and the data line 26. A pixel electrode 32 connected to the TFT T is formed in the pixel region P. The pixel electrode 32 is formed of a transparent conductive material, such as indium-tin-oxide (ITO).

The second substrate, which is referred to as an array substrate, of the LCD device may be fabricated through a five mask process or a six mask process. For example, a five mask process for an array substrate may include a first mask process of forming a gate electrode and a gate line (and a gate pad); a second mask process of forming an active layer and an ohmic contact layer over the gate electrode; a third mask process of forming a data line (and a data pad), a source electrode and a drain electrode; a fourth mask process of forming a passivation layer having a contact hole exposing the drain electrode; and a fifth mask process of forming a pixel electrode connected to the drain electrode through the contact hole. Since the array substrate is fabricated through a complicated mask process, a possibility of deterioration increases and a production yield decreases. In addition, since fabrication time and cost increase, a competitiveness of product is weakened.

To solve the above problems, a four mask process has been suggested. FIG. 2 is a plan view showing an array substrate for an LCD device fabricated through a four mask process according to the related art. In FIG. 2, a gate line 62 and a data line 98 cross each other on a substrate 60 to define a pixel region P. A gate pad 66 is formed at one end of the gate line 62, and a data pad 99 is formed at one end of the data line 98. A gate pad terminal GP is formed on the gate pad 66, and a data pad terminal DP is disposed on the data pad 99.

A thin film transistor (TFT) T including a gate electrode 64, a first semiconductor layer 91, a source electrode 94 and a drain electrode 96 is disposed near a crossing portion of the gate and data lines 62 and 98. The gate electrode 64 is connected to the gate line 62 and the source electrode 94 is connected to the data line 98. The source and drain electrodes 94 and 96 are spaced apart from each other on the first semiconductor layer 91. A pixel electrode PXL is formed in the pixel region P and contacts the drain electrode 96.

A metal layer 97 having an island shape and contacting the pixel electrode PXL overlaps a portion of the gate line 62. The portion of the gate line 62 as a first capacitor electrode, the metal layer 97 as a second capacitor electrode and a gate insulating layer (not shown) between the first and second capacitor electrodes as a dielectric material constitute a storage capacitor Cst.

A second semiconductor layer 92 is formed under the data line 98, and a third semiconductor layer 93 is formed under the metal layer 97. Since the second semiconductor layer 92 extends from the first semiconductor layer 91, a portion of an active layer of the first semiconductor layer 91 is not covered by the gate electrode 64 and is exposed to light from a backlight unit (not shown) under the substrate 60. Since the first semiconductor layer 91 is formed of amorphous silicon, a photo leakage current is generated in the first semiconductor layer 91 due to the light from the backlight unit. As a result, electrical characteristics of the TFT T are degraded due to the photo leakage current.

The second semiconductor layer 92 protrudes beyond the data line 98 because a photoresist (PR) pattern for the second semiconductor layer 92 has a greater width than another PR pattern for the data line 98. The protruding portion of the second semiconductor layer 92 is exposed to the light from the backlight unit or an ambient light. Since the second semiconductor layer 92 is formed of amorphous silicon, a light leakage current is generated in the second semiconductor layer 92. The light leakage current causes a coupling of signals in the data line 98 and the pixel electrode PXL generate electrical defects, such as a wavy noise, when displaying images. A black matrix (not shown) covers the protruding portion of the second semiconductor layer 92 so as to reduce the aperture ratio of the LCD device. Because the pixel electrode PXL is connected to the drain electrode 96 through a contact hole, the first semiconductor layer 91 can be exposed to an ambient light. Thus, the black matrix also covers the contact hole, which further reduces the aperture ratio of the LCD device.

FIGS. 3A and 3B are cross-sectional views taken along lines IIIa-IIIa' and IIIb-IIIb' of FIG. 2, respectively. As shown in FIGS. 3A and 3B, the first semiconductor layer 91 is formed under the source and drain electrodes 94 and 96 and the second semiconductor layer 92 is formed under the data line 98 in an array substrate fabricated through a four mask process according to the related art. The second semiconductor layer 92 extends toward the first semiconductor layer 91. The first semiconductor layer 91 includes an intrinsic amorphous silicon layer as an active layer 91a and an impurity-doped amorphous silicon layer as an ohmic contact layer 91b. The second semiconductor layer 92 includes an intrinsic amorphous silicon layer 92a and an impurity-doped amorphous silicon layer 92b.

A portion of the active layer 91a can not be completely covered by the gate electrode 64. The portion of the active layer 91a is exposed to light from the backlight unit (not shown), and thus a photo current is generated in the active layer 91a. This photo current becomes a leakage current in the TFT T of the pixel region P. As a result, electrical characteristics of the TFT T are degraded.

The intrinsic amorphous silicon layer 92a of the second semiconductor layer 92 protrudes beyond the data line 98. When the protruding portion of the intrinsic amorphous silicon layer 92a is exposed to light from the backlight unit or an ambient light, it is repeatedly activated and inactivated, and thus a light leakage current is generated. Since the light leakage current is coupled with the signal in the pixel electrode PXL, the directional alignment of the liquid crystal molecules is abnormally distorted. Accordingly, undesired wave-shaped thin lines are displayed on the LCD device.

A distance between the data line 98 and the pixel electrode PXL is generally about 4.75 μm in consideration of alignment error in an LCD device formed through a five mask process or a six mask process. The intrinsic amorphous silicon layer 92a of the second semiconductor layer 92 protrudes beyond the data line 98 by about 1.7 μm in an LCD device formed through a four mask process. Accordingly, a distance D between the data line 98 and the pixel electrode PXL is about 6.45 μm (=4.75 um+1.7 um) due to the protrusion of the intrinsic amorphous silicon layer 70. As a result, the pixel electrode PXL in the LCD device formed through the four mask process is farther away from the data line 98 than in the LCD device formed through the five mask process or the six mask process, and a width WI of a black matrix BM to shield the data line 98 and the distance D increases in the LCD device through the four mask process. The increase in the width of the black matrix BM reduces aperture ratio.

FIGS. 4A to 4G are cross-sectional views along line IIIa-IIIa' of FIG. 2, FIGS. 5A to 5G are cross-sectional views along line V-V' of FIG. 2, and FIGS. 6A to 6G are cross-sectional views taken along VI-VI' of FIG. 2, showing a process of fabricating an array substrate for an LCD device through a four mask process according to the related art.

FIGS. 4A, 5A and 6A show a first mask process. In FIGS. 4A, 5A and 6A, a gate line 62, a gate pad 66 and a gate electrode 64 are formed on a substrate 60 having a pixel region P, a switching region S, a gate pad region GP, a data pad region D and a storage region C through a first mask process. The gate pad 66 is formed at one end of the gate line 62.

FIGS. 4B to 4E, 5B to 5E and 6B to 6E show a second mask process. In FIGS. 4B, 5B and 6B, a gate insulating layer 68, an intrinsic amorphous silicon layer 70, an impurity-doped amorphous silicon layer 72 and a metallic material layer 74 are formed on the substrate 60 having the gate line 62. A photoresist (PR) layer 76 is formed on the metallic material layer 74. A mask M is disposed over the photoresist layer 76. The mask M has a transmitting portion B1, a blocking portion B2 and a half-transmitting portion B3. The transmitting portion B1 has a relatively high transmittance so that light through the transmitting portion B1 can completely change the PR layer 76 chemically. The blocking portion B2 shields light completely. The half-transmitting portion B3 has a slit structure or a half-transmitting film so that intensity or transmittance of light through the half-transmitting portion B3 can be lowered. As a result, a transmittance of the half-transmitting portion B3 is smaller than that of the transmitting portion B1 and is greater than that of the blocking portion B2.

The half-transmitting portion B3 and the blocking portions B2 at both sides of the half-transmitting portion B3 correspond to the switching region S. The transmitting portion B1 corresponds to the gate pad region GP, and the blocking portion B2 corresponds to the storage region C and the data pad region DP. The PR layer 76 is exposed to light through the mask M.

In FIGS. 4C, 5C and 6C, first to third PR patterns 78a to 78c are formed in the switching region S, the data pad region DP and the storage region C, respectively. The metallic material layer 74, the impurity-doped amorphous silicon layer 72 and the intrinsic amorphous silicon layer 70 are etched using the first to third PR patterns 78a to 78c.

In FIGS. 4D, 5D and 6D, first to third metal patterns 80, 82 and 86 are formed under the first to third PR patterns 78a to 78c, and first to third semiconductor layers 90a to 90c are formed under the first to third metal patterns 80, 82 and 86. The second metal pattern 82 extends from the first metal pattern 80, and the third metal pattern 86 having an island shape is formed in the storage region C. The first to third semiconductor layers 90a to 90c include an intrinsic amorphous silicon pattern 70a and an impurity-doped amorphous silicon pattern 72a.

A thinner portion of the first PR pattern 78a is removed to expose the first metal pattern 80 by an ashing process. At the same time, boundary portions of the first to third PR patterns 78a to 78c are also removed. As a result, the first to third PR patterns 78a to 78c are partially removed to form fourth to sixth PR patterns 79a to 79c exposing the first to third metal patterns 80, 82 and 86, respectively. The first to third metal patterns 80, 82 and 86 and the impurity-doped amorphous silicon layer 72a of the first to third semiconductor layers 90a to 90c are etched using the fourth to sixth PR patterns 79a to 79c.

In FIGS. 4E, 5E and 6E, the first metal pattern 80 (of FIG. 4D) in the switching region S is etched to form source and drain electrodes 94 and 96, the second metal pattern 84 (of FIG. 6E) in the data pad region DP is etched to form a data line 98 and a data pad 99, and the third metal pattern 86 (of FIG. 4D) in the storage region C is etched to form a metal layer 97. The intrinsic amorphous silicon layer 70a (of FIG. 4D) and the impurity-doped amorphous silicon layer 72a (of FIG. 4D) of the first semiconductor pattern 90a (of FIG. 4D) are etched to form an active layer 91a and an ohmic contact layer 91b, respectively, of a first semiconductor layer 91. The active layer 91a is exposed through the ohmic contact layer 91b and is over-etched so that impurities do not remain on the active layer 92a. In addition, the second and third semiconductor patterns 90b and 90c (of FIGS. 6D and 4D) are etched to form second and third semiconductor layers 92 and 93, respectively. An overlapped portion of the gate line 62 as a first capacitor electrode and the metal layer 97 as a second capacitor electrode constitutes a storage capacitor Cst with the interposed gate insulating layer 68 and the third semiconductor layer 93.

FIGS. 4F, 5F, and 6F show a third mask process. In FIGS. 4F, 5F, and 6F, a passivation layer PAS is formed on the substrate 60 having the data line 98. The passivation layer PAS is patterned through a third mask process to form a drain contact hole CH1 exposing the drain electrode 96, a storage contact hole CH2 exposing the metal layer 97, and a data pad contact hole CH4 exposing the data pad 99. Also, the passivation layer PAS and the gate insulating layer 68 are patterned through the third mask process to form a gate pad contact hole CH3 exposing the gate pad 66.

FIGS. 4G, 5G and 6G show a four mask process. In FIGS. 4G, 5G and 6G, a transparent conductive material is deposited on the passivation layer PAS and patterned through a fourth mask process to form a pixel electrode PXL, a gate pad terminal GPT and a data pad terminal DPT. The pixel electrode PXL contacts the drain electrode 96 through the drain contact hole CH1 and the metal layer 97 through the storage contact hole CH2. The gate pad terminal GPT contacts the gate pad 66 through the gate pad contact hole CH3, and the data pad terminal DPT contacts the data pad 99 through the data pad contact hole CH4.

Through the above four mask process, the array substrate is fabricated. As explained above, the intrinsic amorphous silicon layer of the second semiconductor layer protrudes beyond the data line. Accordingly, wavy noise occurs and aperture ratio is reduced. Further, since the active layer is connected to the intrinsic amorphous silicon layer of the second semiconductor layer, a portion of the active layer is not covered by the gate electrode. Accordingly, the light leakage current is generated in the thin film transistor. Also, because the active layer should be formed thickly in consideration of the over-etching, fabrication time and product cost increase. Moreover, since the pixel electrode is connected to the drain electrode through a contact hole and the first semiconductor layer is exposed to an ambient light, a black matrix covering the contact hole is required. As a result, aperture ratio is further reduced due to the black matrix.

SUMMARY OF THE INVENTION

Accordingly, the present invention is directed to an array substrate for a liquid crystal display device and a method of fabricating the same that substantially obviates one or more of problems due to limitations and disadvantages of the related art.

Additional features and advantages of the invention will be set forth in the description which follows, and in part will be apparent from the description, or may be learned by practice of the invention. The other advantages of the invention will be realized and attained by the structure particularly pointed out in the written description and claims hereof as well as the appended drawings.

To achieve these and other advantages and in accordance with the purpose of the present invention, as embodied and broadly described, an array substrate for a liquid crystal display device includes a gate line and a data line crossing each other on a substrate to define a pixel region, an insulating layer between the gate line and the data line, a gate electrode extending from the gate line, and a transistor in the pixel region having an active layer on the insulating layer, ohmic contact layers of a first material that are adjacent to ends of the active layer, buffer layers of a second material, which is different from the first material, on the ohmic contact layers, a source electrode contacting one of the buffer layers and a drain electrode contacting another one of the buffer layers, wherein the active layer is in an island shape over the gate electrode and within a boundary defined by a perimeter of the gate electrode.

In another aspect, an array substrate for a liquid crystal display device includes a gate line and a data line crossing each other on a substrate to define a pixel region, an insulating layer between the gate line and the data line, a transistor in the pixel region having an active layer on the insulating layer and ohmic contact layers of a first material that are adjacent to ends of the active layer, source and drain electrodes each having a transparent layer and an opaque layer for connecting to the ohmic contact layers, wherein the active layer is in an island shape over the gate electrode and within a boundary defined by a perimeter of the gate electrode.

In another aspect, a method of fabricating an array substrate for a liquid crystal display device includes: forming a gate electrode on a substrate and a gate line connected to the gate electrode; forming a first insulating layer on the gate line and gate electrode; forming an active layer on the first insulating layer; forming an ohmic contact layer on the active layer; patterning the active layer and the ohmic contact layer to form an island shape over the gate electrode and within a boundary defined by a perimeter of the gate electrode having an active layer pattern; forming a transparent conductive material layer and an opaque conductive material layer over the island shape; patterning the transparent conductive material layer and the opaque conductive material layer to form source and drain electrodes; patterning the ohmic contact pattern to form ohmic contact layers adjacent to the ends of the active layer under the source and electrodes; forming a second insulating layer over the substrate; and patterning the second insulating layer and the opaque conductive material layer of the drain electrode to form the pixel electrode.

In another aspect, a method of fabricating an array substrate for a liquid crystal display device includes: forming a gate electrode, a gate line connected to the gate electrode and a gate pad at one end of the gate line through a first mask process; forming a first insulating layer, an active layer and an ohmic contact pattern on the gate electrode through a second mask process, the first gate insulating layer exposing the gate pad; forming source and drain electrodes on the ohmic contact pattern, a pixel pattern connected to the drain electrode, a data line connected to the source electrode, a data pad pattern at one end of the data line and a gate pad terminal pattern contacting the gate pad through a third mask process, the pixel pattern including a first pixel metal layer of a transparent conductive material and a second pixel metal layer of an opaque conductive material, the data pad pattern including a first data pad metal layer of the transparent conductive material and a second data pad metal layer of the opaque conductive material, the gate pad terminal pattern including a first gate pad terminal metal layer of the transparent conductive material and a second gate pad terminal metal layer of the opaque conductive material; and removing the second pixel pattern metal layer, the second gate pad terminal metal layer and the second data pad metal layer through a fourth mask process to form a pixel electrode of the first pixel pattern metal layer, a gate pad terminal of the first gate pad terminal metal layer and a data pad of the first data pad metal layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 3A are cross-sectional views taken along lines IIIa-IIIa' of FIG. 2;

FIGS. 5A to 5G are cross-sectional views along line V-V' of FIG. 2;

DETAILED DESCRIPTION OF THE ILLUSTRATED EMBODIMENTS

Reference will now be made in detail to the illustrated embodiments of the present invention, which are illustrated in the accompanying drawings.

In an embodiment of the present invention, an array substrate where an amorphous silicon layer does not protrude beyond a data line is fabricated through a four mask process.

Figure 1:
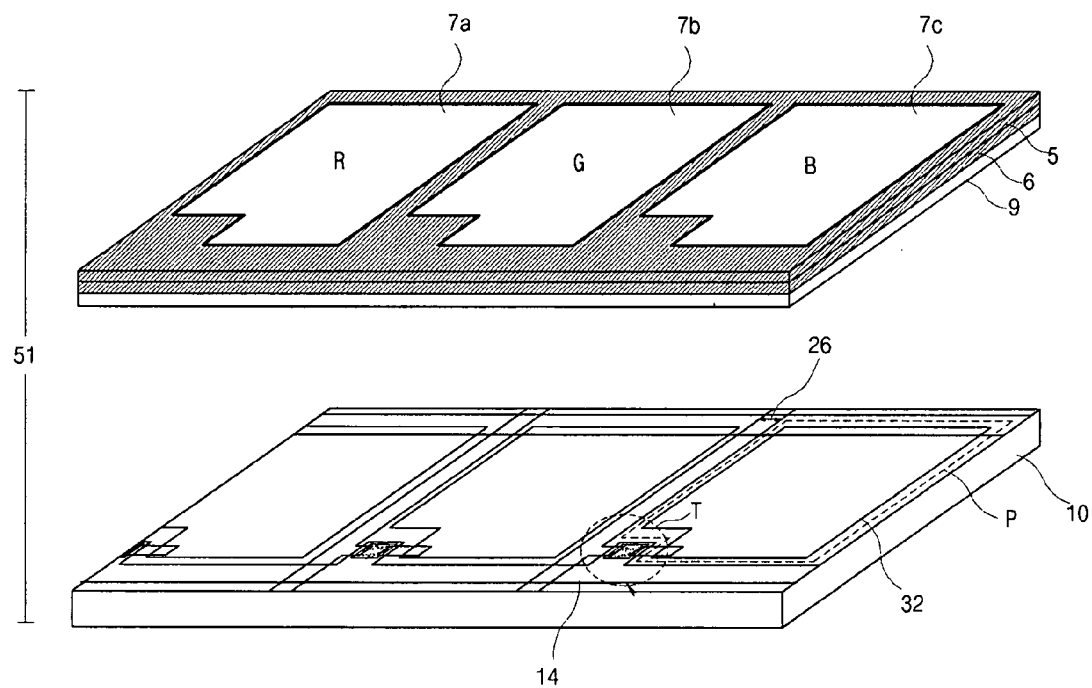
FIG. 1 is a perspective view showing an LCD device according to the related art.
Figure 2:
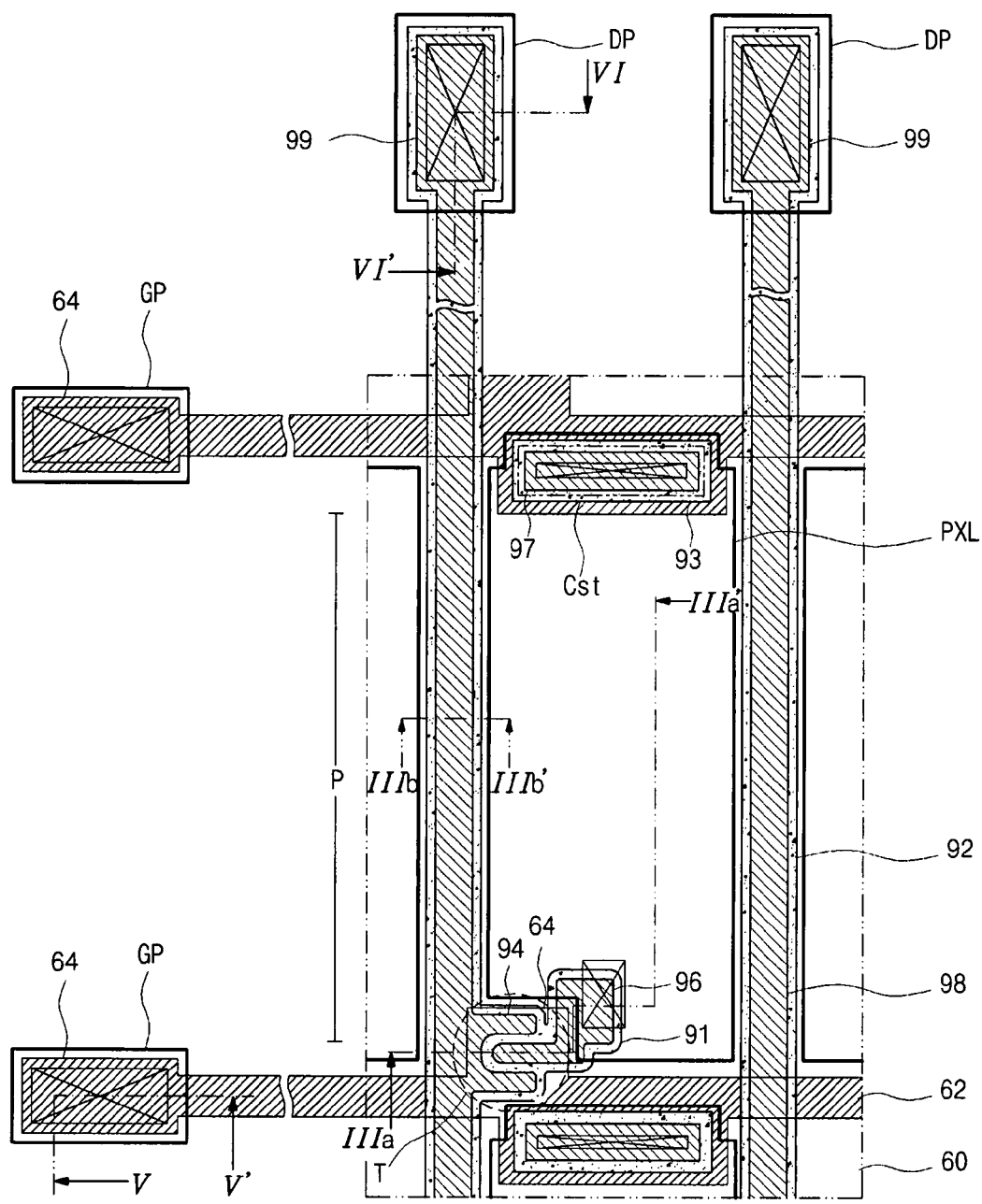
FIG. 2 is a plan view showing an array substrate for an LCD device fabricated through a four mask process according to the related art.
Figure 3B:
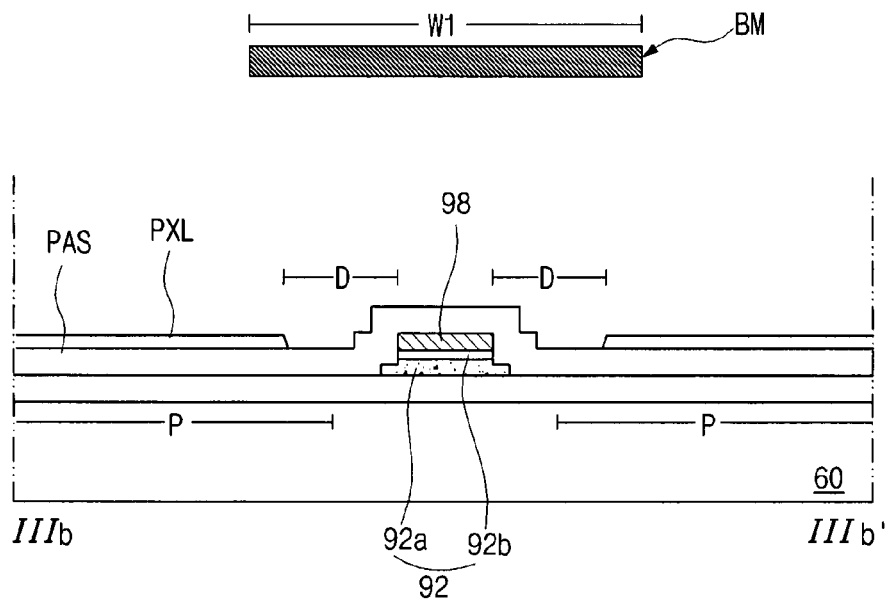
FIG. 3B are cross-sectional views taken along lines IIIb-IIIb' of FIG. 2.
Figure 4A:
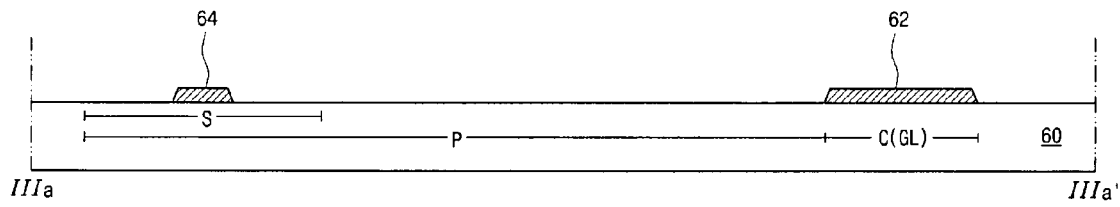
FIGS. 4A to 4G are cross-sectional views along line IIIa-IIIa' of FIG. 2 showing a process of fabricating an array substrate for an LCD device through a four mask process according to the related art.
Figure 4B:
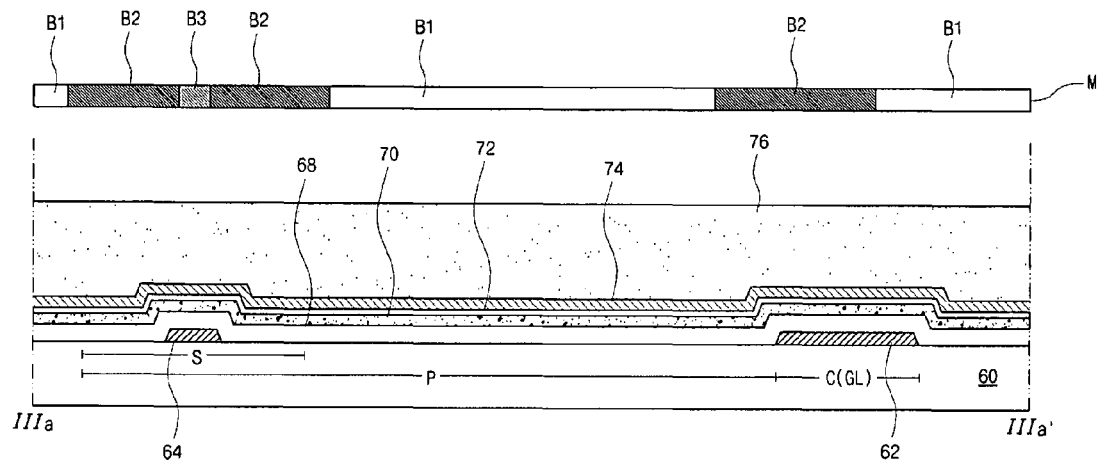
Figure 4C:
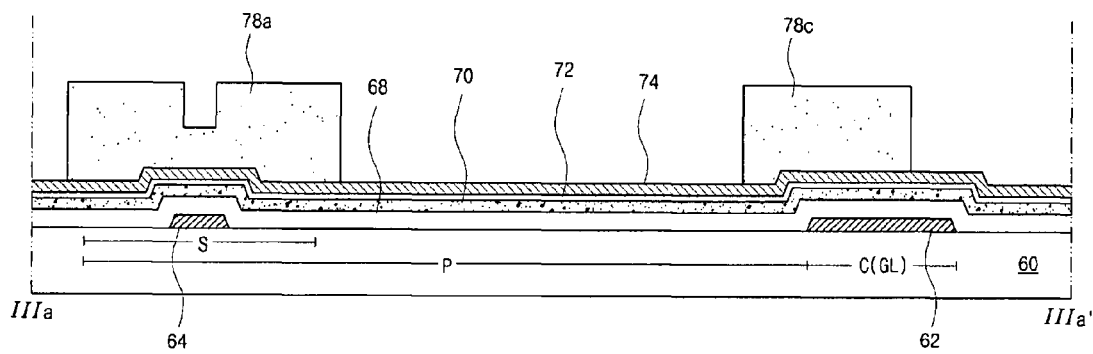
Figure 4D:
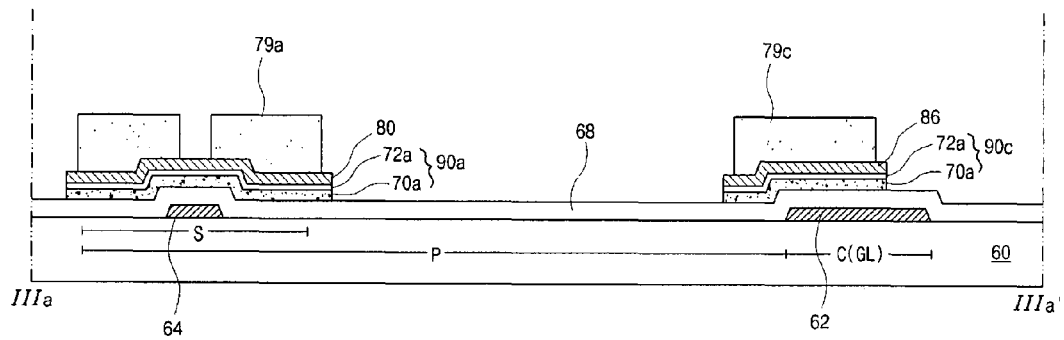
Figure 4E:
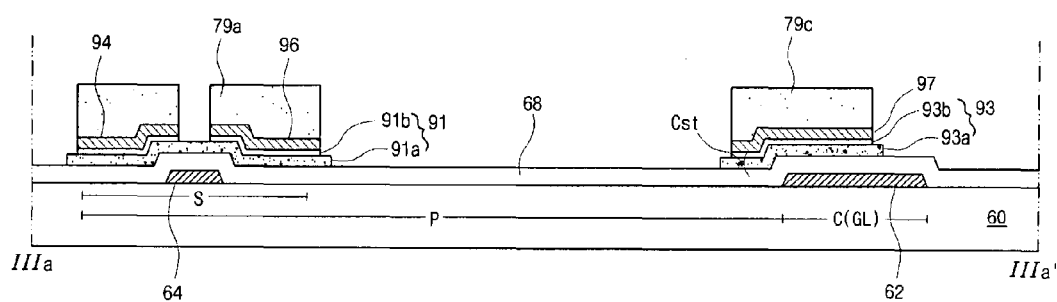
Figure 4F:
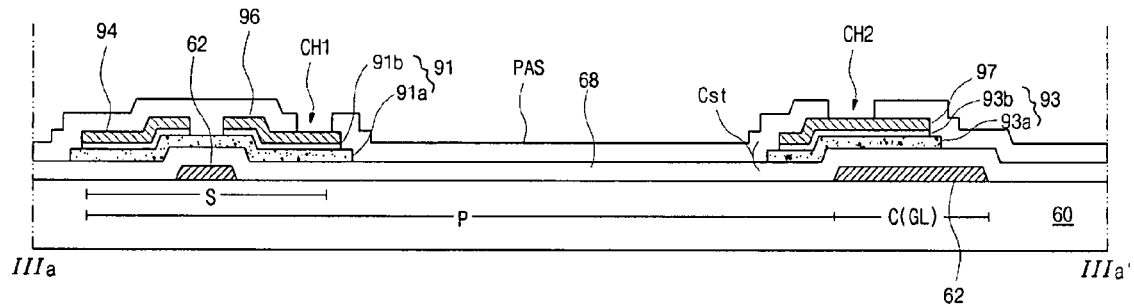
Figure 4G:
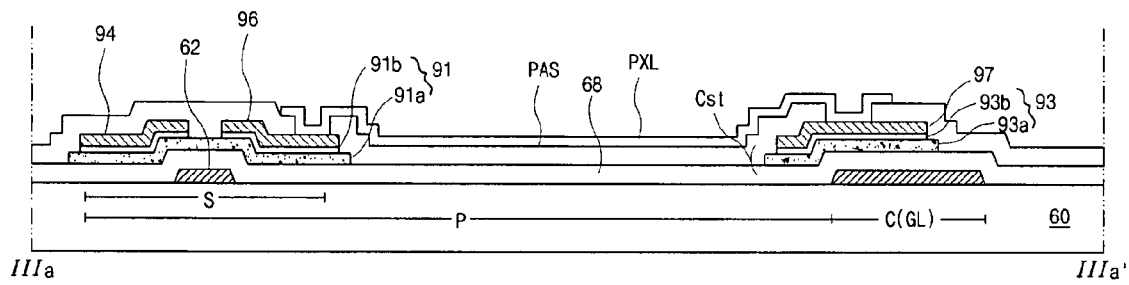
Figure 5A:
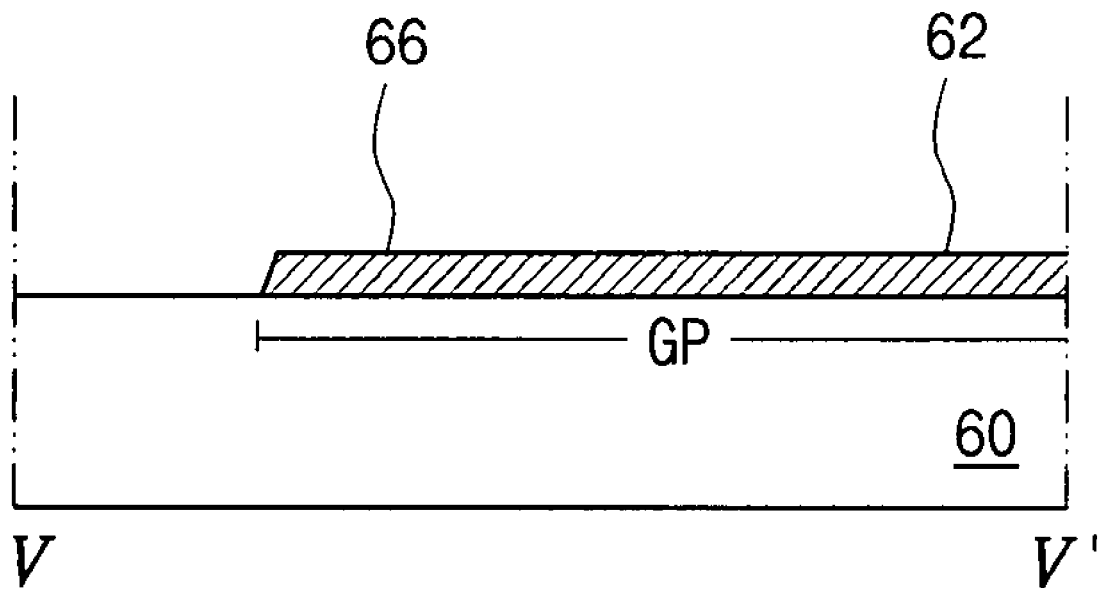
Figure 5C:
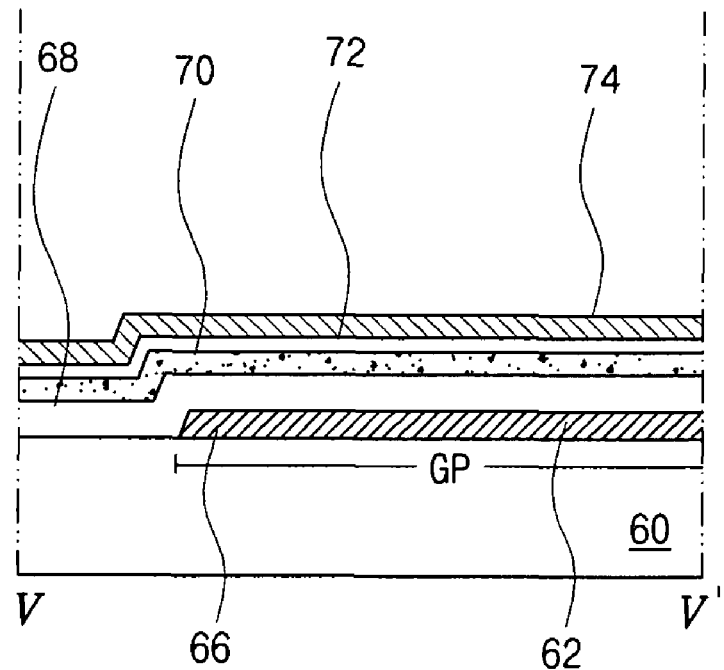
Figure 5D:
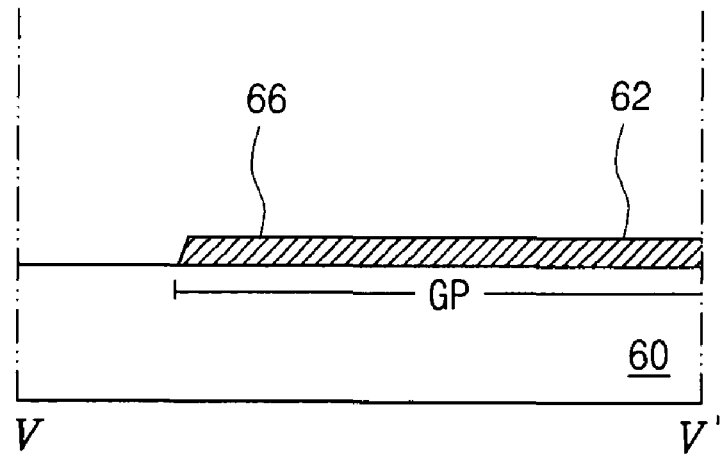
Figure 5E:
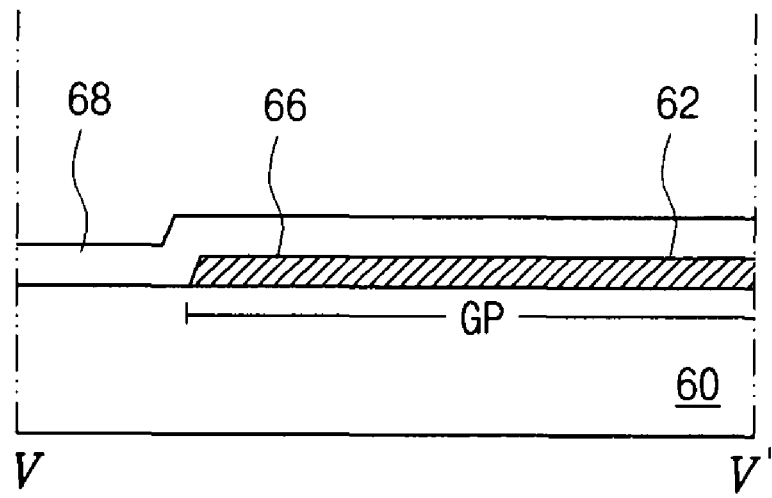
Figure 5F:
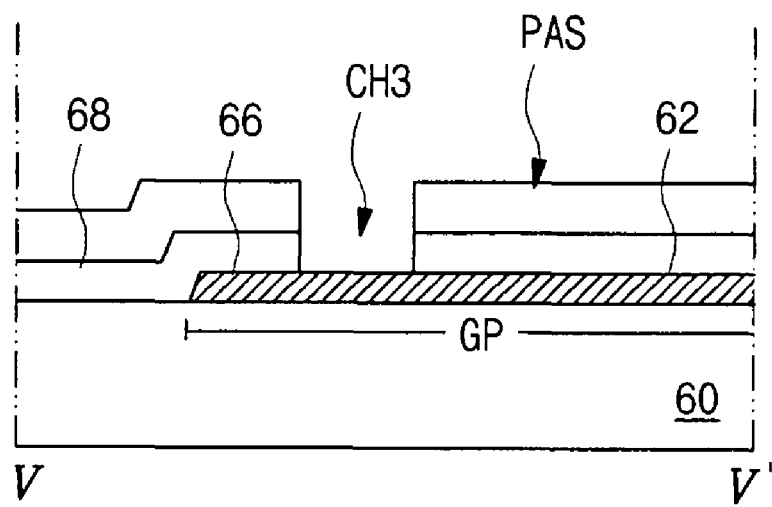
Figure 5G:
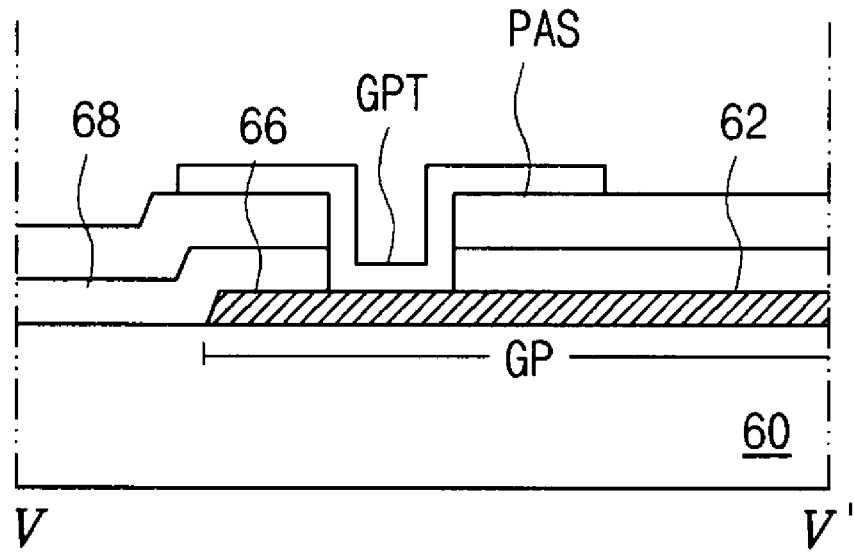
Figure 6A:
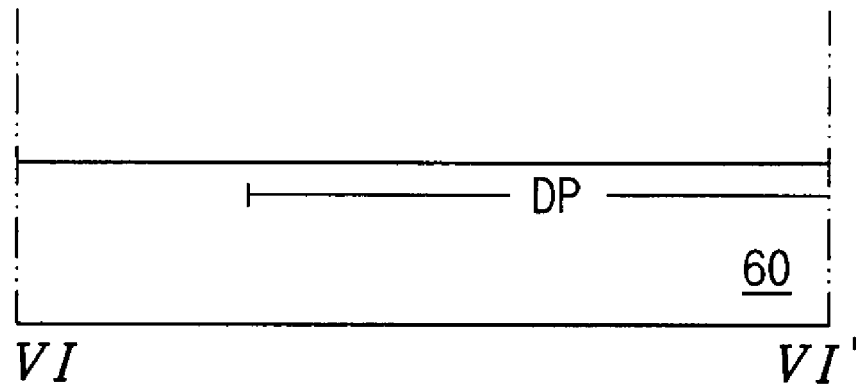
FIGS. 6A to 6G are cross-sectional views taken along VI-VI' of FIG. 2 showing a process of fabricating an array substrate for an LCD device through a four mask process according to the related art.
Figure 6B:
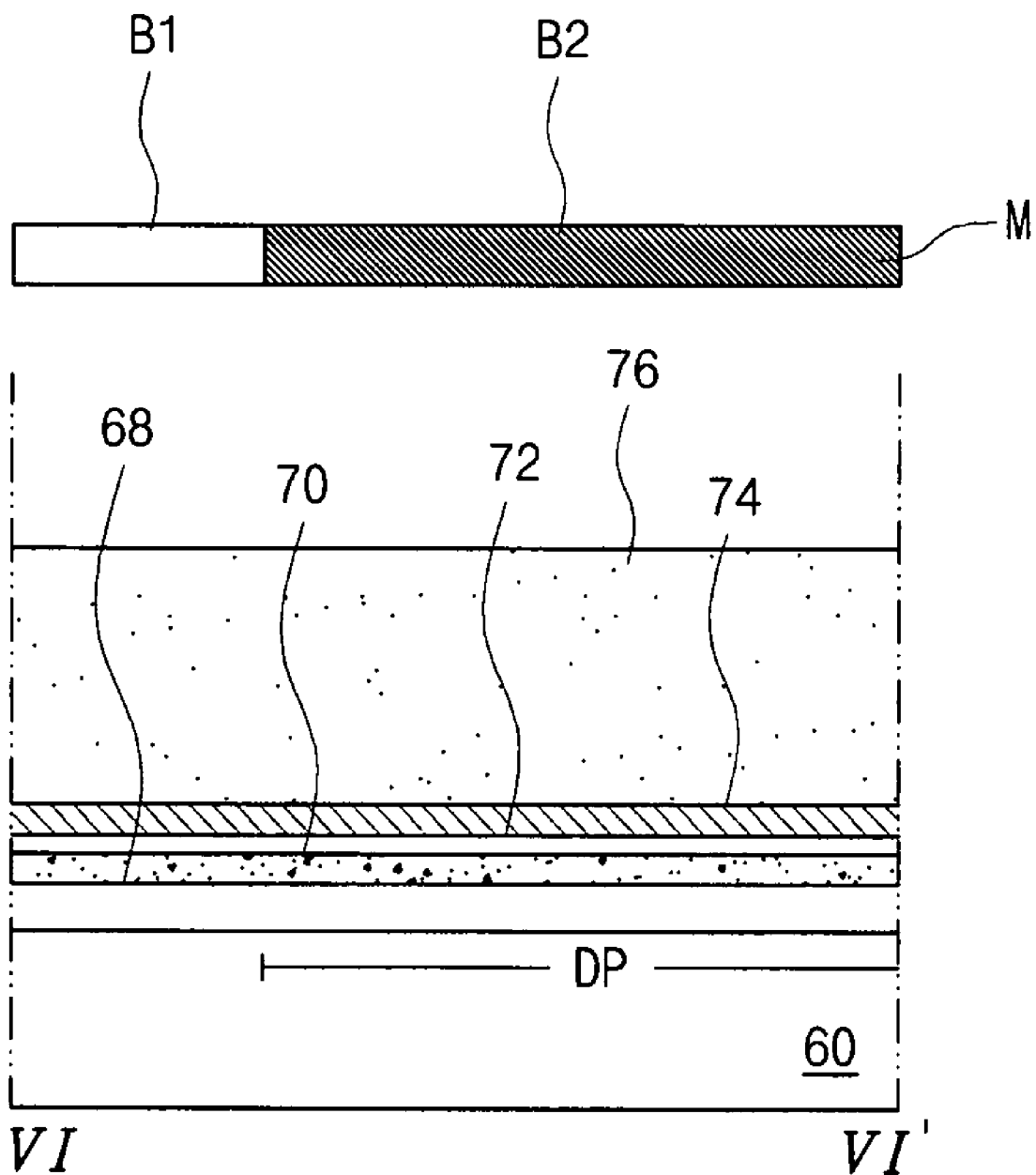
Figure 6C:
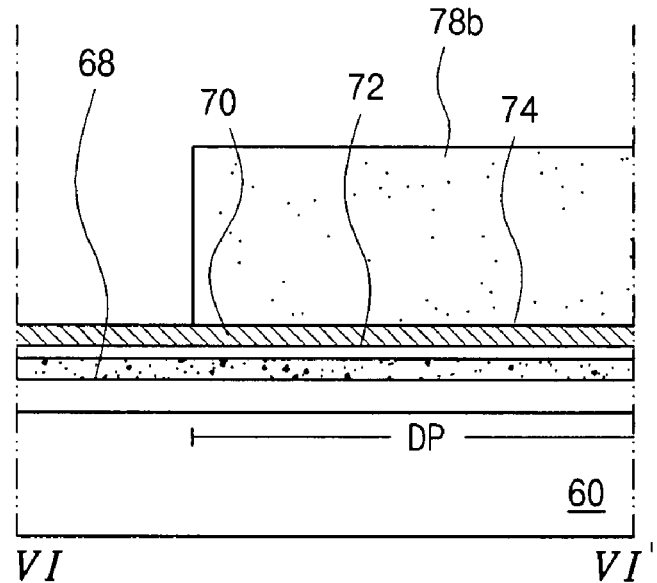
Figure 6D:
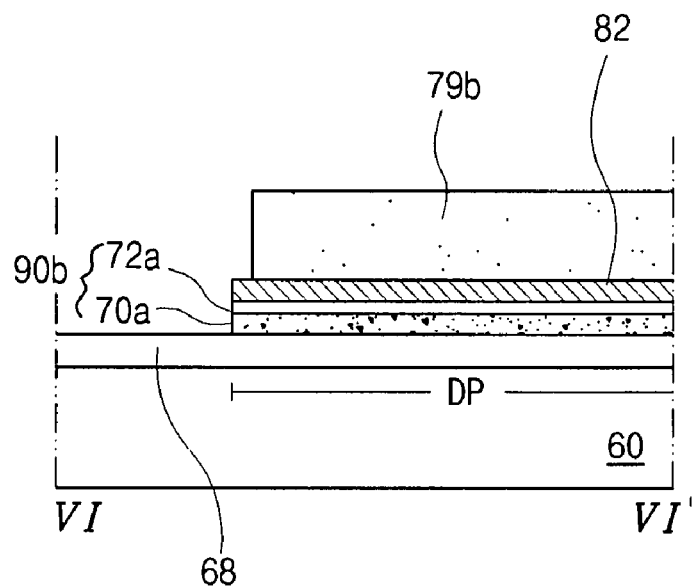
Figure 6E:
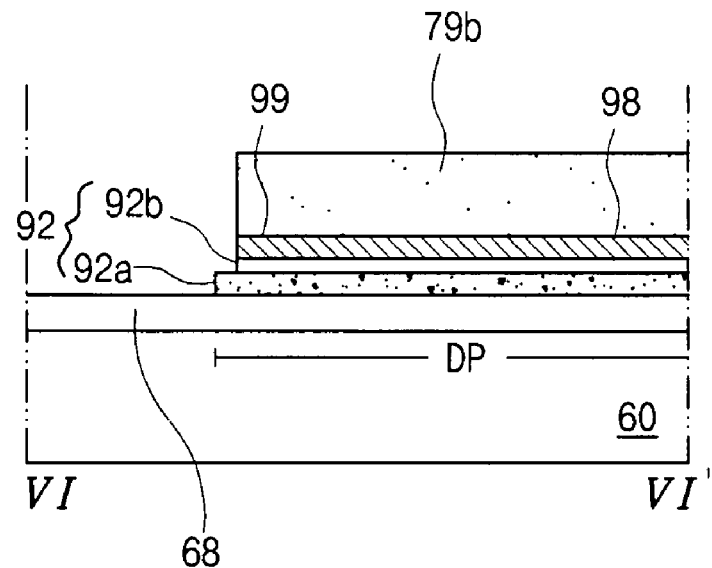
Figure 6F:
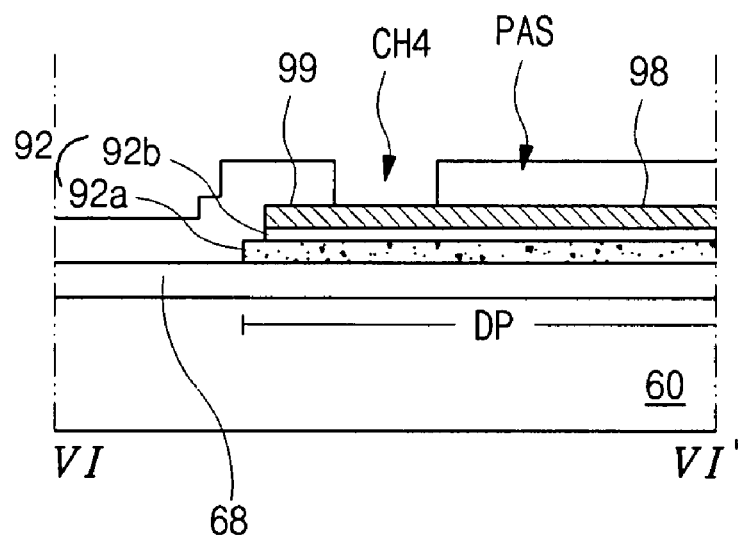
Figure 6G:
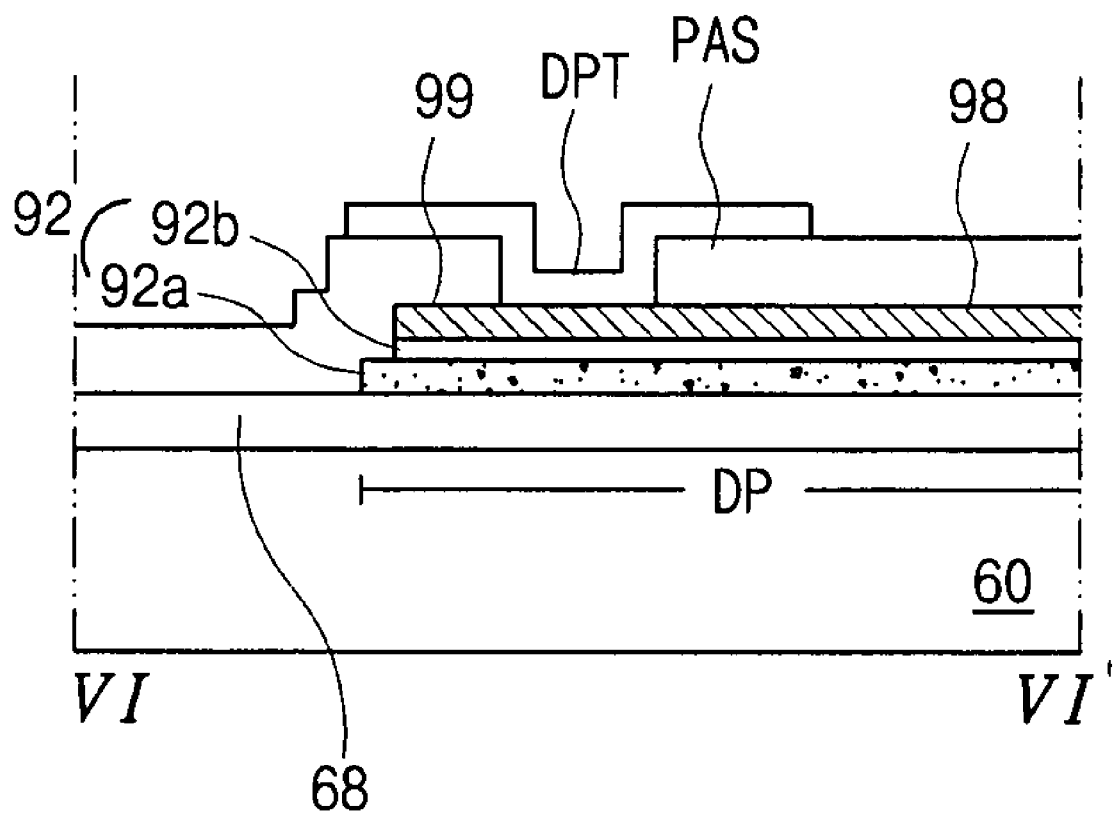
Figure 7:
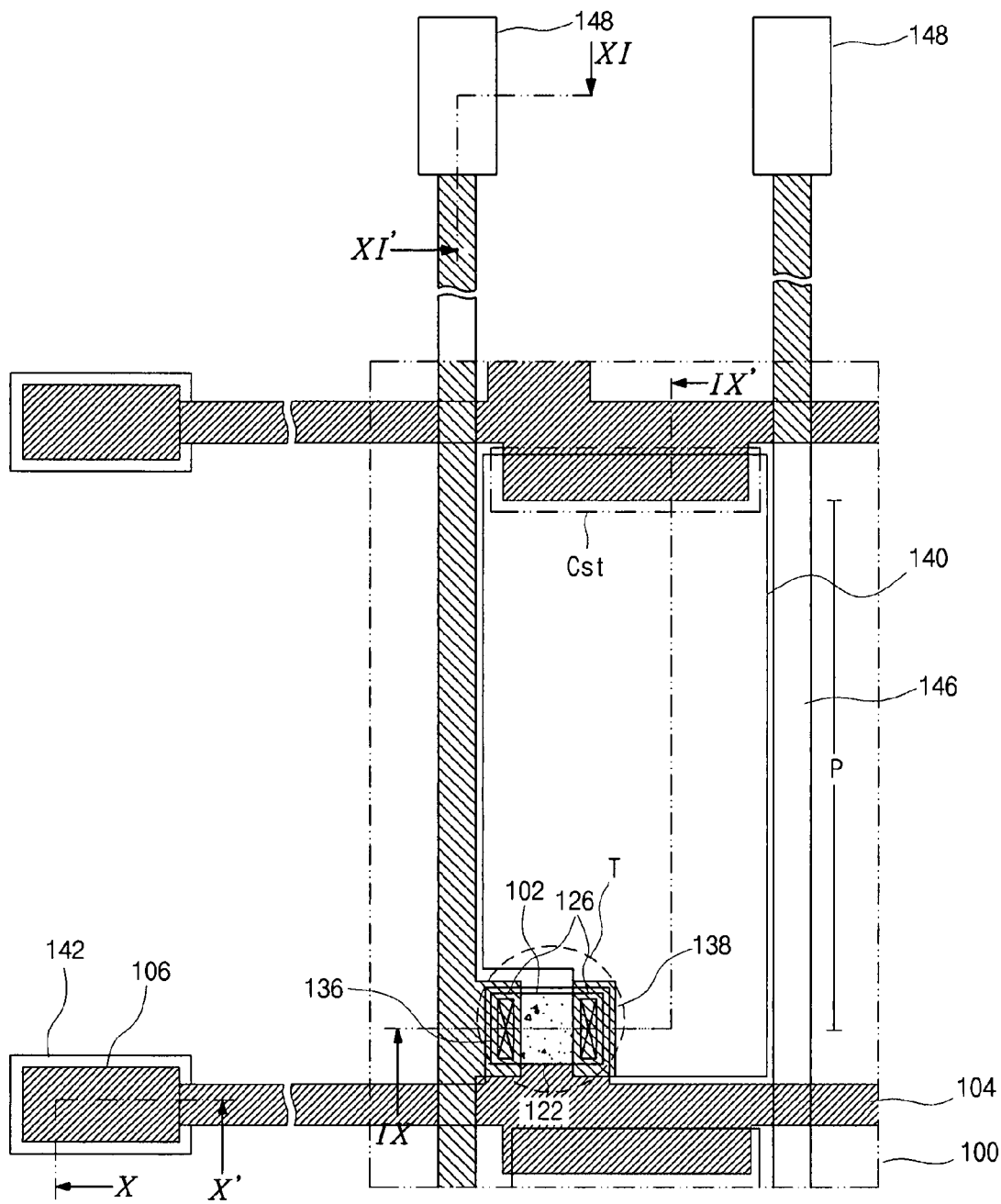
FIG. 7 is a plan view showing an array substrate for an LCD device according to an embodiment of the present invention.

FIG. 7 is a plan view showing an array substrate for an LCD device according to an embodiment of the present invention. As shown in FIG. 7, a gate line 104 and a data line 146 cross each other on a substrate 100 to define a pixel region P. A gate pad 106 and a data pad 148 are formed at ends of the gate line 104 and the data line 146, respectively. A transparent gate pad terminal 142 is formed on the gate pad 106. A thin film transistor (TFT) T is connected to the gate line 104 and the data line 146 in the pixel region P. The TFT T includes a gate electrode 102, an active layer 122, ohmic contact layers (not shown) adjacent to ends of the active layer 122, buffer metal layers 126 on the ohmic contact layers, a source electrode 136 and a drain electrode 138. The gate electrode 102 and the source electrode 136 are connected to gate line 104 and the data line 146, respectively. Buffer metal layers 126 are formed between the ohmic contact layers and each of the source electrode 136 and the drain electrode 138. In the alternative, the buffer metal layers 126 can be omitted such that the source electrode 136 and drain electrode 138 respectively contact the ohmic contact layers. A transparent pixel electrode 140 extends from and is connected to the drain electrode 138. The gate line 104 and the pixel electrode 140 overlap each other to constitute a storage capacitor Cst such that an overlapped portion of the gate line 104 and an overlapped portion of the pixel electrode 140 function as a first capacitor electrode and a second capacitor electrode, respectively.

In the array substrate for an LCD device, the active layer 122 of amorphous silicon has an island shape formed within the gate electrode 102 and an amorphous silicon layer is not formed under the data line 146. Since the gate electrode 102 shields light from a backlight unit (not shown) under the array substrate, the active layer 122 is not exposed to the light and a light leakage current is not generated in the TFT T. Further, since the amorphous silicon layer having a protruding portion is not formed under the data line 146, wavy noise does not occur in the LCD device and a black matrix covering the protruding portion is not necessary. As a result, aperture ratio of the LCD device is improved. Moreover, since the pixel electrode 140 directly contacts the drain electrode 138 without a contact hole, a black matrix covering the contact hole for preventing a light incident through the contact hole is not necessary. Therefore, aperture ratio of the LCD device is further improved.

Figure 8A:
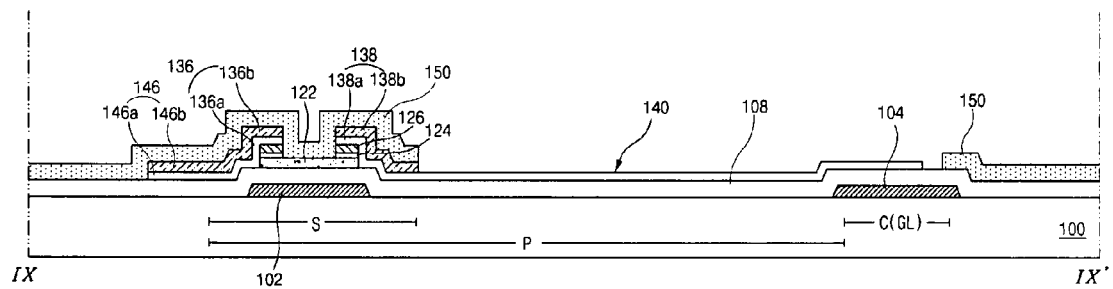
FIGS. 8A, 8B and 8C are cross-sectional views taken along lines IX-IX', X-X' and XI-XI' of FIG. 7, respectively.
Figure 8B:
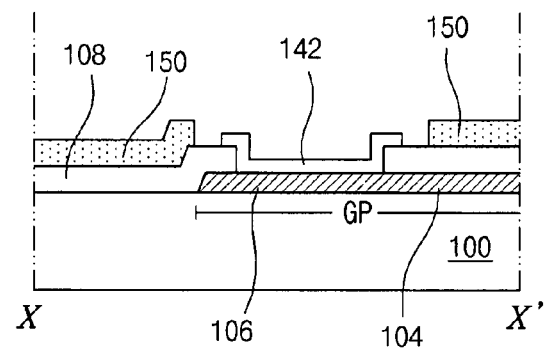
Figure 8C:
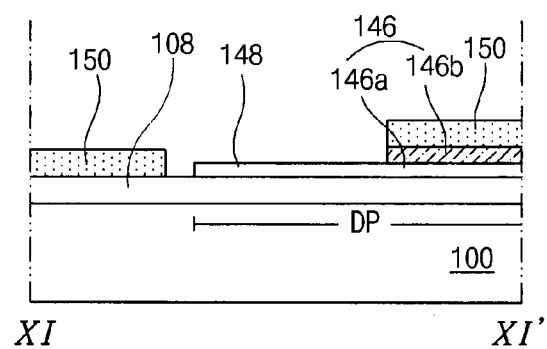

FIGS. 8A, 8B and 8C are cross-sectional views taken along lines IX-IX', X-X' and XI-XI' of FIG. 7, respectively. FIG. 8A shows a switching region and a pixel region, FIG. 8B shows a gate pad region, and FIG. 8C shows a data pad region.

In FIGS. 8A, 8B and 8C, a substrate 100 includes a plurality of pixel regions P, a gate pad region GP and a data pad region DP at a periphery of the plurality of pixel regions P. A portion of a gate line region GL where a gate line is formed is defined as a storage region C where a storage capacitor is formed. Each pixel region P includes a switching region S.

A thin film transistor (TFT) T including a gate electrode 102, a first insulating layer 108, an active layer 122, ohmic contact layers 124 on the active layer 122 adjacent to the ends of the active layer, buffer metal layers 126 on the ohmic contact layers 124, a source electrode 136 and a drain electrode 138 is formed in the switching region S on the substrate 100 and a second insulating layer 150 is formed on the TFT T. The first insulating layer 108 is formed on the gate electrode 102 and the active layer 122 is formed on the first insulating layer 108. The ohmic contact layers 124 are formed on the active layer 122. The buffer metal layers 126 are formed between the ohmic contact layer 124 and the source electrode 136 and between the ohmic contact layer 124 and the drain electrode 138. Thus, the source electrode 136 and the drain electrode 138 are connected to the ohmic contact layers 124 through the buffer metal layer 126 an are also in direct contact with the ohmic contact layers 124.

The source electrode 136 includes first and second source metal layers 136a and 136b, and the drain electrode 138 includes first and second drain metal layers 138a and 138b. The first source metal layer 136a is formed of the same material and in the same layer as the first drain metal layer 138a. For example, the first source metal layer 136a and the first drain metal layer 138a may include a transparent conductive material. In addition, the second source metal layer 136b is formed of the same material and the same layer as the second drain metal layer 138b. For example, the second source metal layer 136b and the second drain metal layer 138b may include a metallic material. If the first source metal layer 136a and the first drain metal layer 138a just directly contact the ohmic contact layer 124, the TFT T may have a relatively high contact resistance of the source and drain electrodes 136 and 138 or a rectifying contact instead of an ohmic contact. The buffer metal layers 126 can be formed between the first source and first drain metal layers 136a and 138a and the ohmic contact layers 124 to reduce contact resistance so as to obtain an ohmic contact. As shown in FIG. 8A, the first source metal layer 136a can directly contact an end of the active layer 122, one of the ohmic contact layers 124, one of the buffer metal layers 126 and the first insulating layer 108 while the first drain metal layer 136a can directly contact another end of the active layer 122, the other one of the ohmic contact layers 124, the other one of the buffer metal layers 126 and the first insulating layer 108.

In another embodiment, when the TFT T has a relatively low contact resistance and an ohmic contact, the buffer metal layers 126 can be omitted. For example, after the ohmic contact layers 124 are formed, the ohmic contact layers 124 may be treated with a plasma to form a very thin silicon nitride (SiNx) layer on a surface of the ohmic contact layers 124 as buffer separation layers. Then, the first source and first drain metal layers 136a and 138a may be formed on the buffer separation layers. The TFT T can still have a relatively low contact resistance and an ohmic contact due to the very thin SiNx layer without the buffer metal layers.

A gate line 104 connected to the gate electrode 102 is formed on the substrate 100 and a gate pad 106 is formed at one end of the gate line 104 in the gate pad region GP. A data line 146 connected to the source electrode 136 and crossing the gate line 104 is formed on the first insulating layer 108 and a data pad 148 is formed at one end of the data line 146 in the data pad region DP. The data line 146 includes a first data metal layer 146a of the transparent conductive material and a second data metal layer 146b of the metallic material, while the data pad 148 includes a single layer of the transparent conductive material. The first insulating layer 108 covers the gate line 104 and the gate pad 106 is exposed through the first insulating layer 108. In addition, the second insulating layer 150 covers the data line 146 and the data pad 148 is exposed through the second insulating layer 150. Further, a gate pad terminal 142 of the transparent conductive material is formed on the gate pad 106.

The active layer 122 of intrinsic amorphous silicon (a-Si: H) is an island shape formed directly over the underlying gate electrode 102 and within a boundary defined by the perimeter of the underlying gate electrode 102. In addition, the data line 146 is formed directly on the first insulating layer 108 without an additional intrinsic amorphous silicon layer and an additional impurity-doped amorphous silicon layer therebetween. Accordingly, an electrical problem, such as a wavy noise, is prevented and picture quality is also improved due to prevention of the light leakage current. Because a black matrix covering the protruding portion is not necessary, the aperture ratio increases.

FIGS. 9A to 9L are cross-sectional views taken along line IX-IX' of FIG. 7 showing a fabrication process of an array substrate for an LCD device according to an embodiment of the present invention. FIGS. 10A to 10L are cross-sectional views taken along line X-X' of FIG. 7 showing a fabrication process of an array substrate for an LCD device according to an embodiment of the present invention. FIGS. 11A to 11L are cross-sectional views taken along line XI-XI' of FIG. 7 showing a fabrication process of an array substrate for an LCD device according to an embodiment of the present invention. More specifically, FIGS. 9A to 9L show the pixel region and the switching region, FIGS. 10A to 10L show the gate pad region and FIGS. 11A to 11L show the data pad region.

Figure 9A:
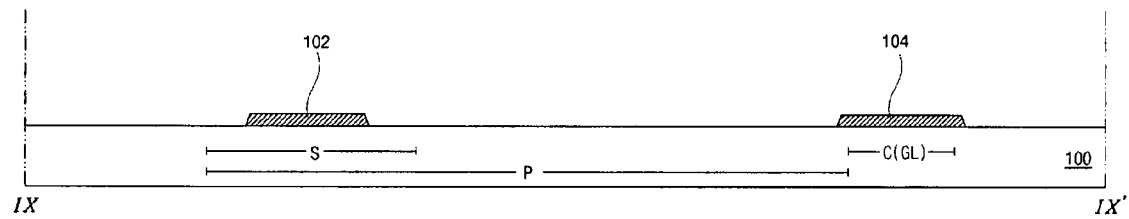
FIGS. 9A to 9L are cross-sectional views taken along line IX-IX' of FIG. 7 showing a fabrication process of an array substrate for an LCD device according to an embodiment of the present invention.
Figure 10A:
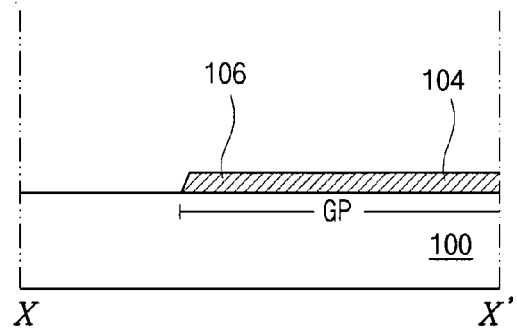
FIGS. 10A to 10L are cross-sectional views taken along line X-X' of FIG. 7 showing a fabrication process of an array substrate for an LCD device according to an embodiment of the present invention.
Figure 11A:
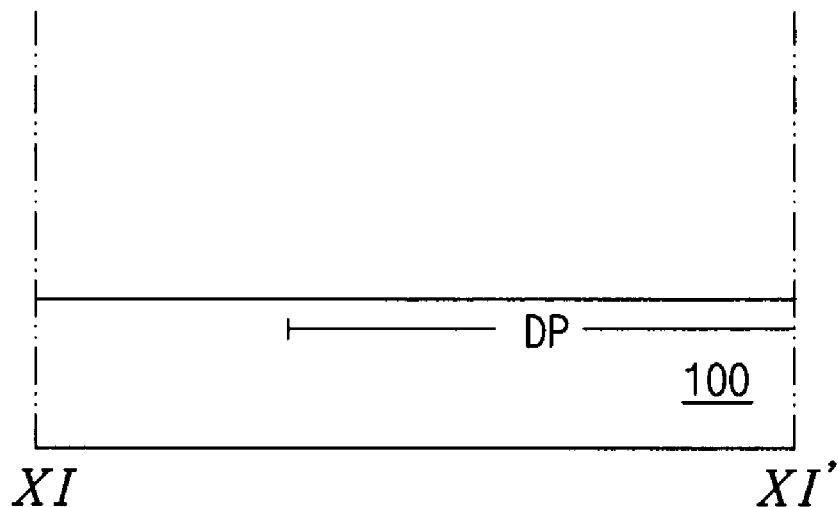
FIGS. 11A to 11L are cross-sectional views taken along line XI-XI' of FIG. 7 showing a fabrication process of an array substrate for an LCD device according to an embodiment of the present invention.

FIGS. 9A, 10A and 11A show a first mask process. In FIGS. 9A, 10A and 11A, a first metal layer (not shown) is formed on a substrate 100 by depositing one or more conductive metallic materials, including aluminum (Al), aluminum (Al) alloy, chromium (Cr), molybdenum (Mo), tungsten (W), titanium (Ti), copper (Cu), copper (Cu) alloy and tantalum (Ta). The first metal layer is patterned through a first mask process using a first mask (not shown) to form a gate electrode 102 in the switching region S, a gate line 104 and a gate pad 106 in the gate pad region GP. The gate electrode 102 is connected to the gate line 104 and the gate pad 106 is formed at one end of the gate line 104.

Figure 9B:
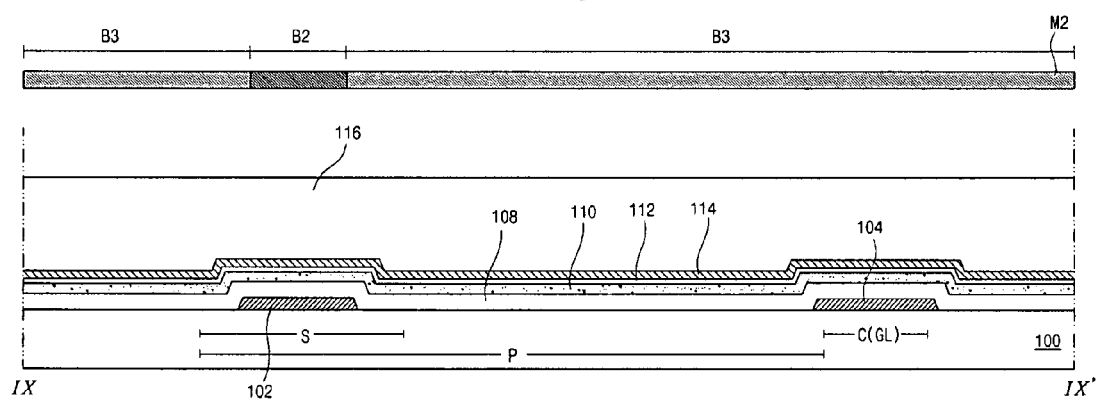
Figure 9C:
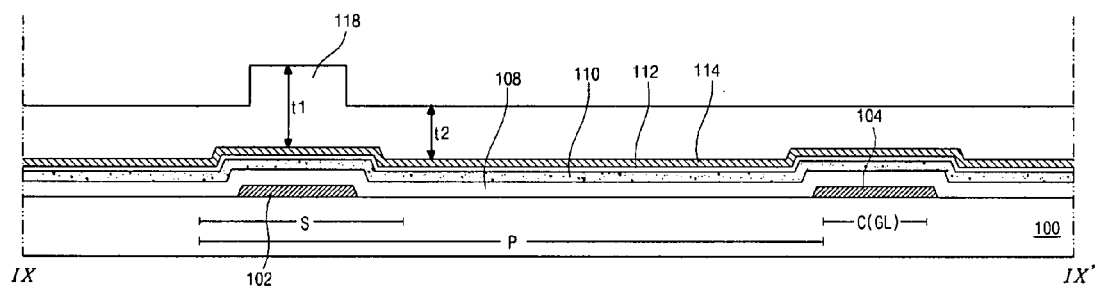
Figure 9D:
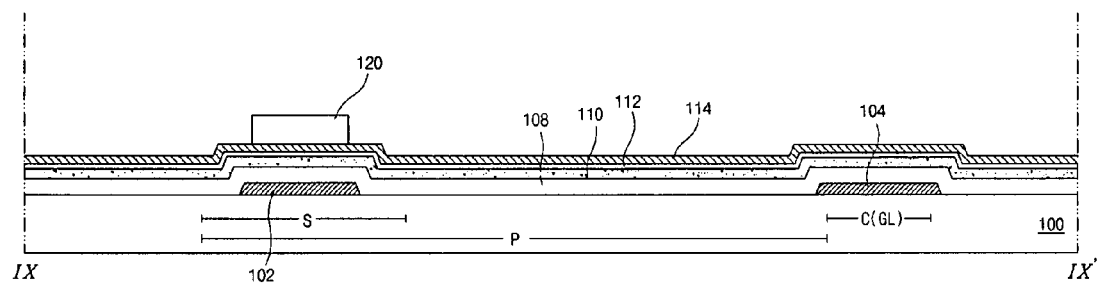
Figure 9E:
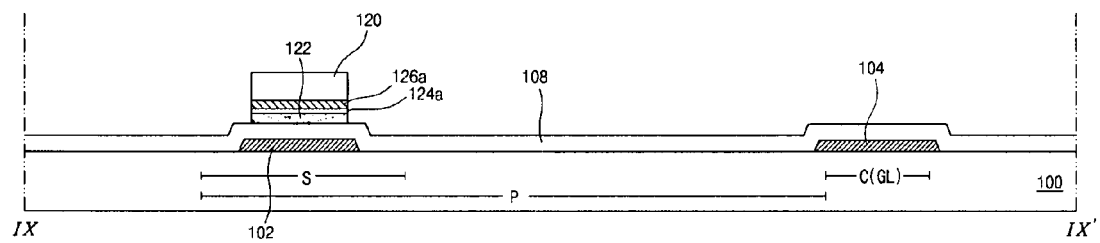
Figure 10B:
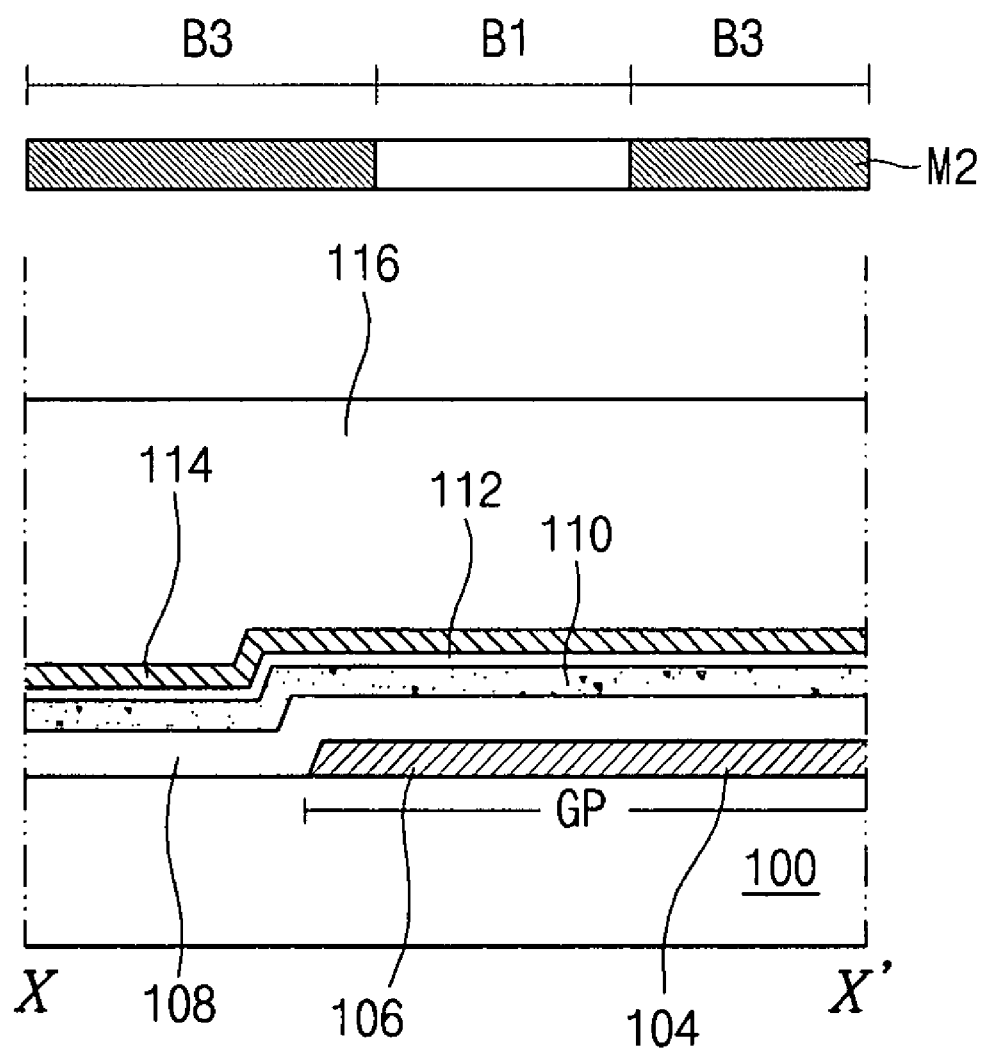
Figure 10C:
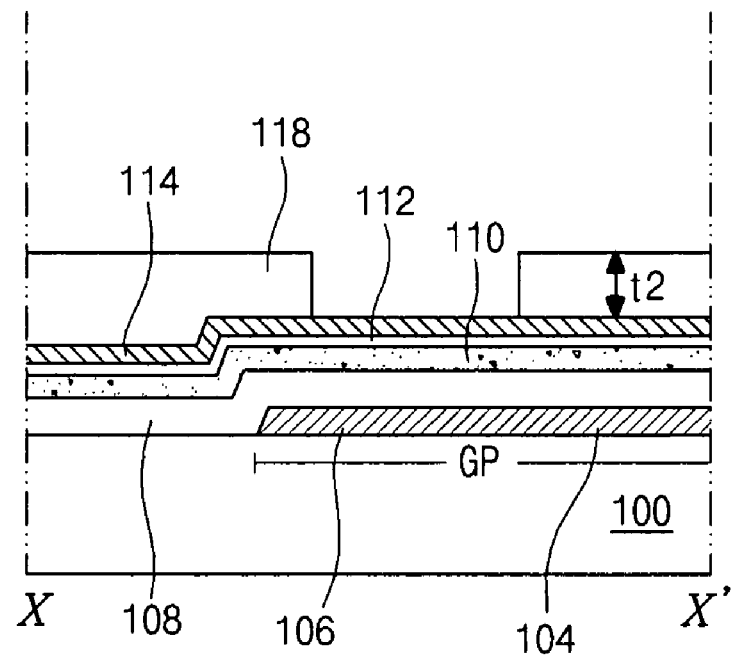
Figure 10D:
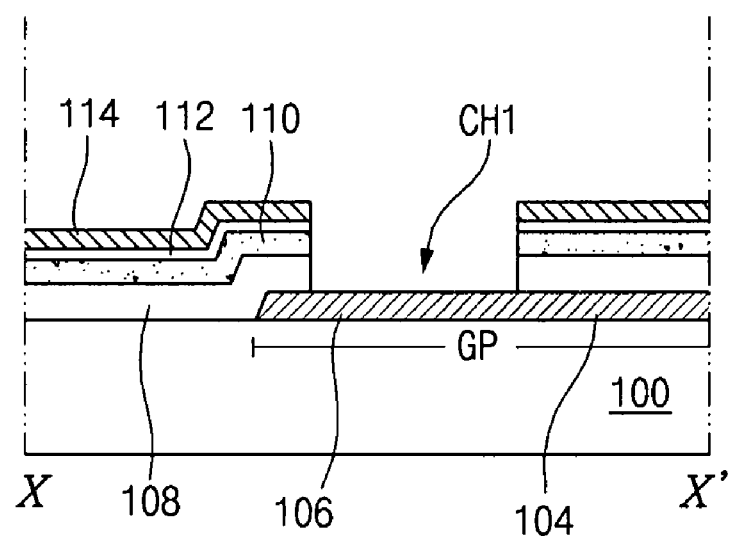
Figure 10E:
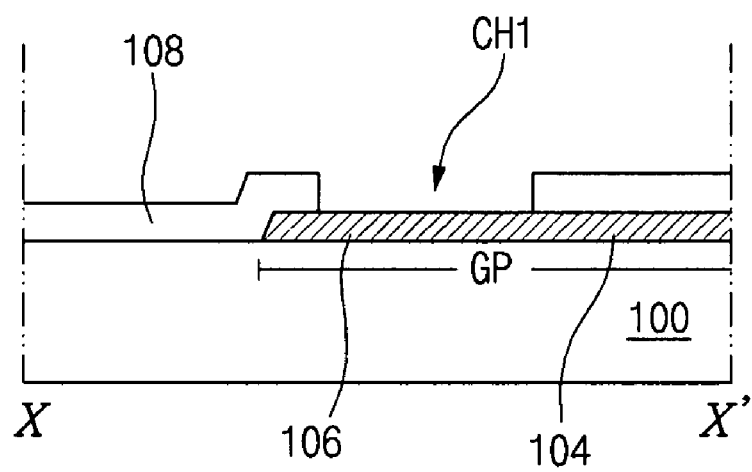
Figure 11B:
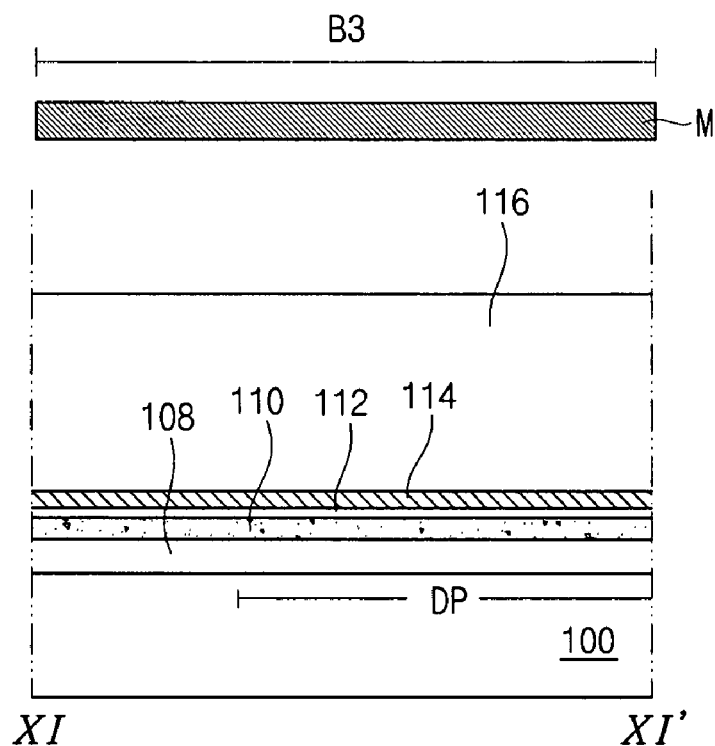

FIGS. 9B to 9E, 10B to 10E and 11B to 11E show a second mask process. In FIGS. 9B, 10B and 11B, a first insulating layer 108, an intrinsic amorphous silicon layer 110, an impurity-doped amorphous silicon layer 112 and a second metal layer 114 are sequentially formed on the gate electrode 102, the gate line 104 and the gate pad 106. A first photoresist (PR) layer 116 is formed on the second metal layer 114. The first insulating layer 108 may include an inorganic insulating material, such as silicon nitride (SiNx) and silicon oxide (SiO$_2$), and the second metal layer 114 may include one or more conductive metallic materials, including aluminum (Al), aluminum (Al) alloy, chromium (Cr), molybdenum (Mo), tungsten (W), titanium (Ti), copper (Cu), copper (Cu) alloy and tantalum (Ta).

A second mask M2 having a transmitting portion B1, a blocking portion B2 and a half-transmitting portion B3 is disposed over the first PR layer 116 such that the blocking portion B2 corresponds to the switching region S, the transmitting portion B1 corresponds to the gate pad 106 and the half-transmitting portion B3 corresponds to the data pad region DP. An area of the blocking portion B2 corresponding to the switching region S is smaller than an area of the gate electrode 102. The first PR layer 116 is exposed to light through the first mask M1 and then the exposed first PR layer 116 is developed.

Figure 11C:
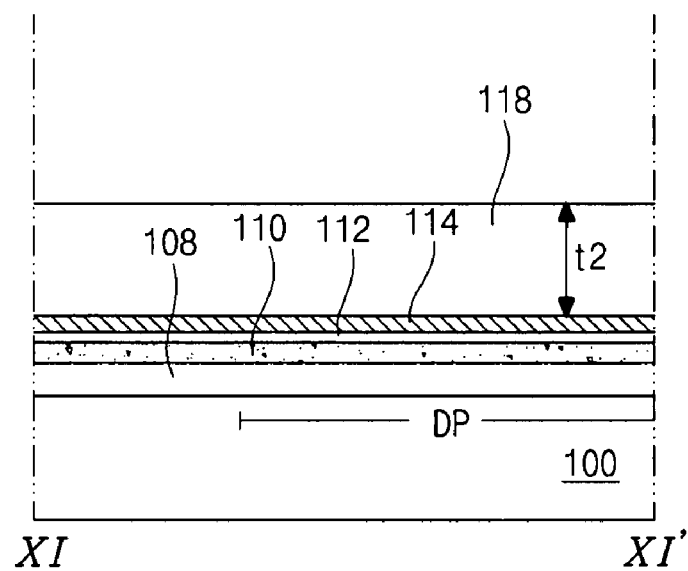

In FIGS. 9C, 10C and 11C, a first PR pattern 118 is formed on the second metal layer 114. A portion of the first PR pattern 118 corresponding to the switching region S has a first thickness t1 and the other portion of the first PR pattern 118 has a second thickness t2 smaller than the first thickness t1 (t2<t1). The gate pad 106 is exposed through the first PR pattern 118.

The second metal layer 114, the impurity-doped amorphous silicon layer 112, the intrinsic amorphous silicon layer 110 and the first insulating layer 108 are patterned using the first PR pattern 118 as an etching mask to form an island shape directly over the gate electrode 102 and within a boundary defined by a perimeter of the gate electrode 102. Next, the first PR pattern 118 is removed, for example, by an ashing process form a second PR pattern 120 in the switching region S. The portion of the first PR pattern 118 having the first thickness t1 is partially removed to form the second PR pattern 120 having a thickness corresponding to the difference of the first and second thicknesses (t1-t2) and the other portion of the first PR pattern 118 having the second thickness t2 is completely removed to expose the second metal layer 114.

Figure 11D:
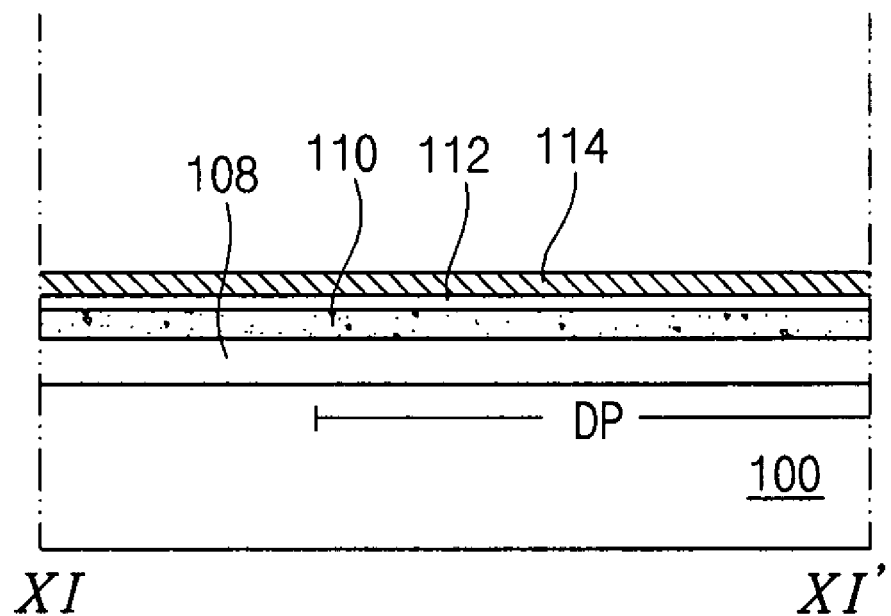

In FIGS. 9D, 10D and 11D, the gate pad 106 is exposed through a gate pad contact hole CH1 in the first insulating layer 108, the intrinsic amorphous silicon layer 110, the impurity-doped amorphous silicon layer 112 and the second metal layer 114, and the second PR pattern 120 is formed on the second metal layer 114 in the switching region S. The second metal layer 114, the impurity-doped amorphous silicon layer 112 and the intrinsic amorphous silicon layer 110 are patterned using the second PR pattern 120 as an etching mask.

Figure 11E:
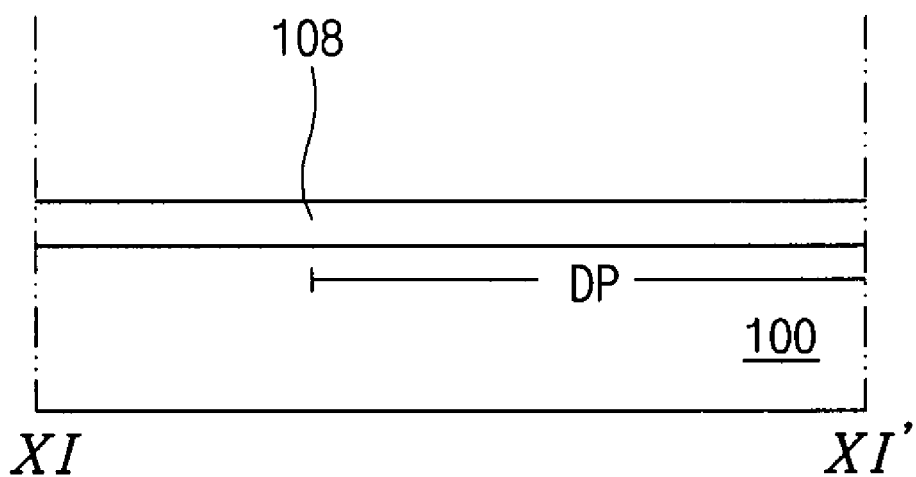

In FIGS. 9E, 10E and 11E, an active layer 122 of intrinsic amorphous silicon, an ohmic contact pattern 124a of impurity-doped amorphous silicon and a buffer metal pattern 126a are sequentially formed on the first insulating layer 110 over the gate electrode 102 in the switching region S. In the other region, the first insulating layer 110 having the gate pad contact hole CH1 is exposed and the gate pad 106 is exposed through the gate pad contact hole CH1.

Figure 9F:
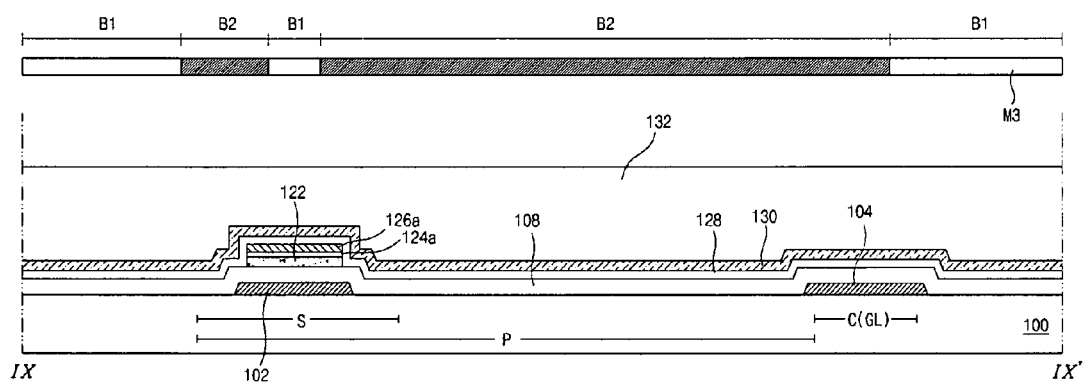
Figure 9G:
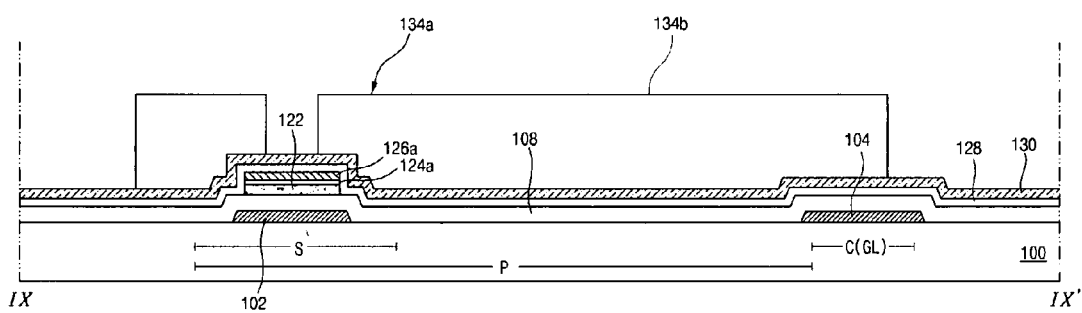
Figure 9H:
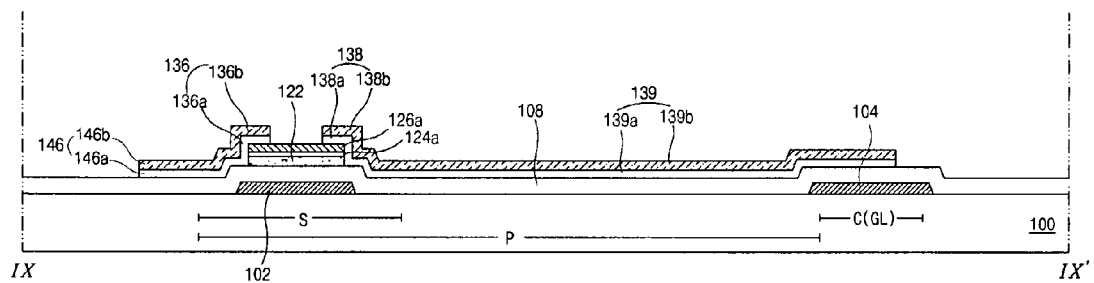
Figure 10F:
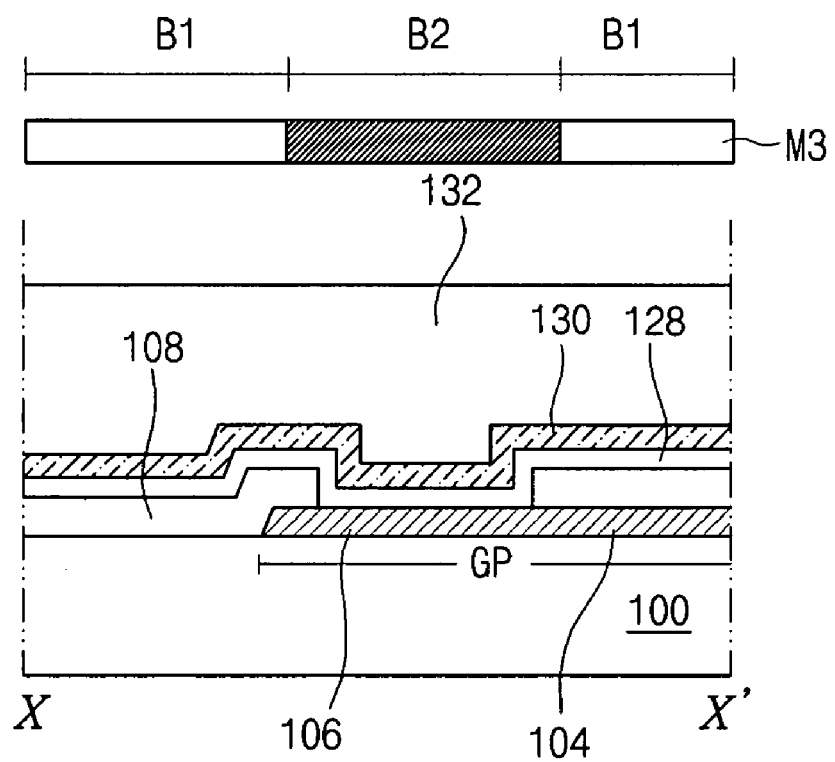
Figure 10G:
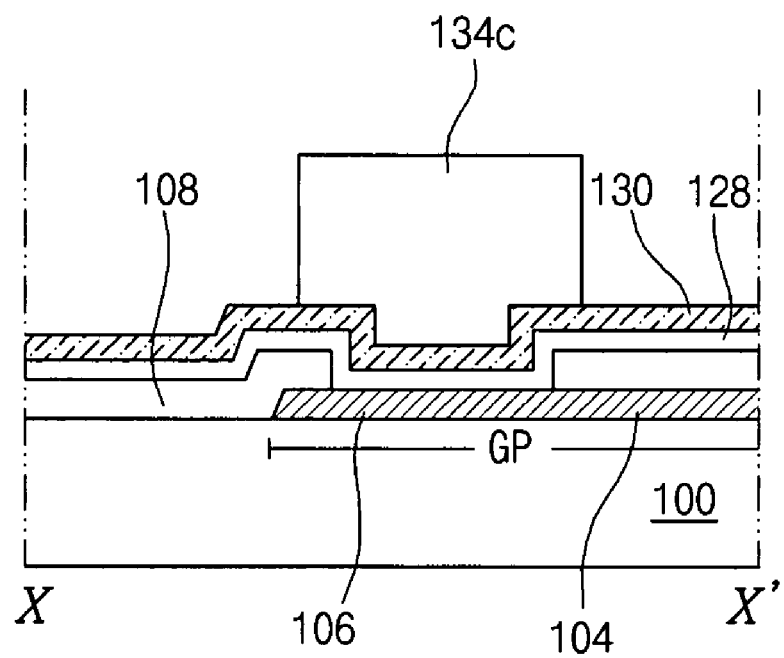
Figure 10H:
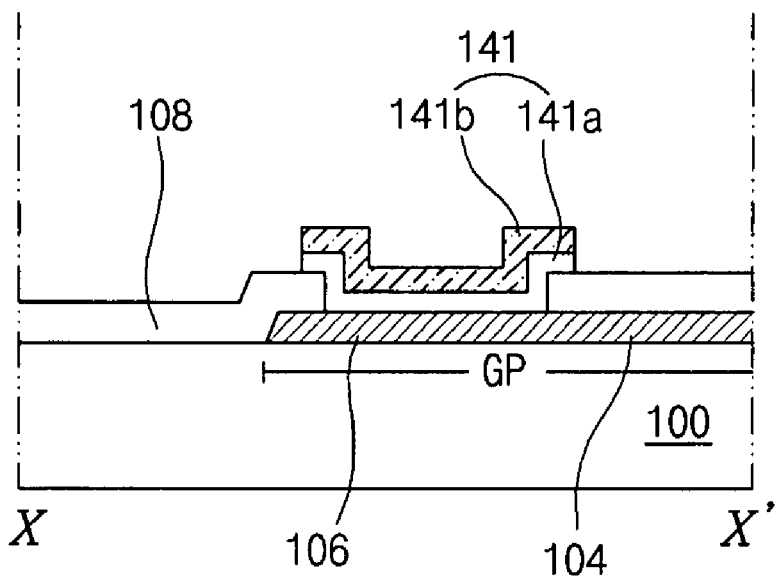
Figure 11F:
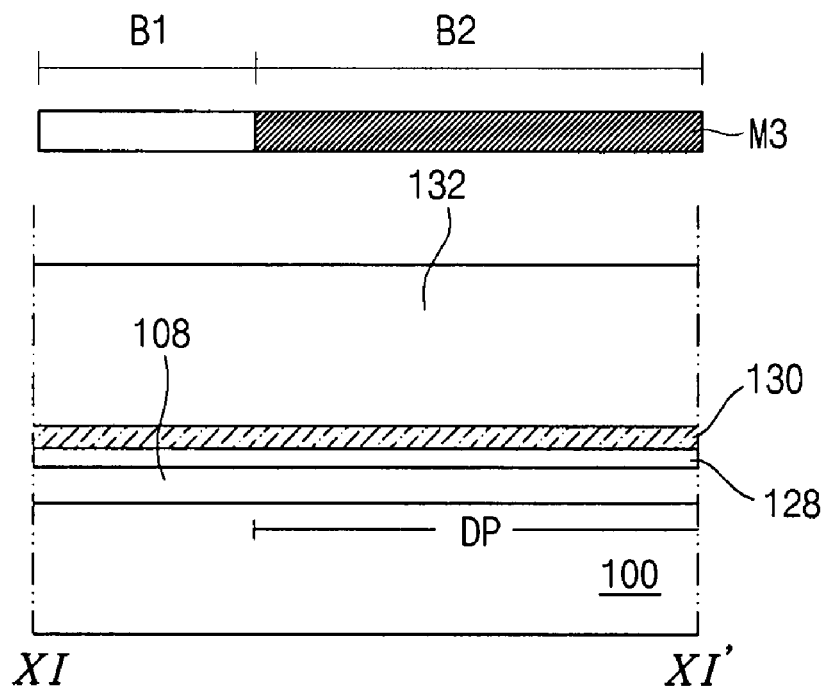

FIGS. 9F to 9H, 10F to 10H and 11F to 11H show a third mask process. In FIGS. 9F, 10F and 11F, a transparent conductive layer 128 and an opaque conductive layer 130 are sequentially formed on the substrate 100. Next, a second PR layer 132 is formed on the opaque conductive layer 130. The transparent conductive layer 128 includes a transparent conductive material, such as indium-tin-oxide (ITO) and indium-zinc-oxide (IZO), and the opaque conductive layer 130 is one or more selected from metallic conductive material group including aluminum (Al), aluminum (Al) alloy, chromium (Cr), molybdenum (Mo), tungsten (W), titanium (Ti), copper (Cu), copper (Cu) alloy and tantalum (Ta).

A third mask M3 having a transmitting portion B1 and a blocking portion B2 is disposed over the second PR layer 132 such that the transmitting portion B1 and the blocking portion B2 at both sides of the transmitting portion B1 correspond to the switching region S, and the blocking portion B2 corresponds to the gate pad 106 and the data pad region DP. The second PR layer 132 is exposed to light through the third mask M3 and then the exposed second PR layer 132 is developed.

Figure 11G:
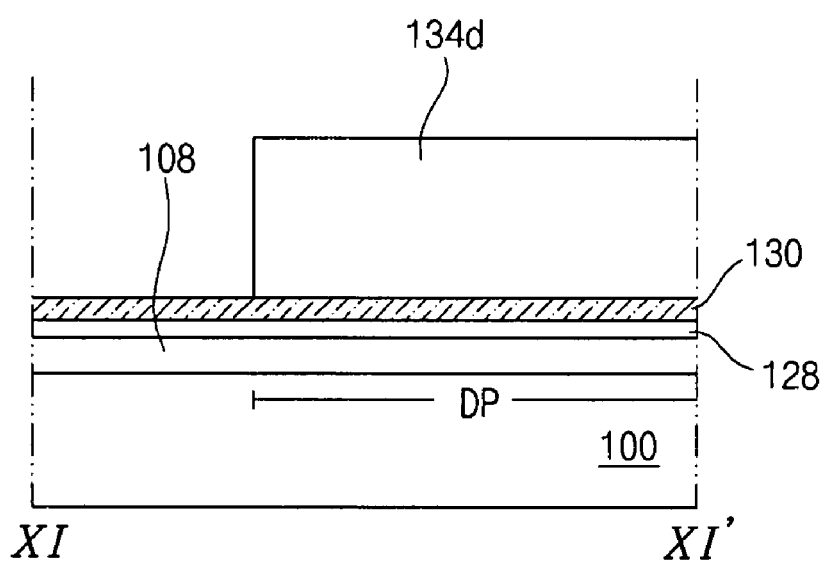

As shown in FIGS. 9G, 10G and 11G, third, fourth, fifth and sixth PR patterns 134a, 134b, 134c and 134d are formed on the opaque conductive layer 130. The third, fourth, fifth and sixth PR patterns 134a, 134b, 134c and 134d correspond to the switching region S, the pixel region P, the gate pad 106 and the data pad region DP, respectively. The opaque conductive layer 130 and the transparent conductive layer 128 are sequentially patterned using the third, fourth, fifth and sixth PR patterns 134a, 134b, 134c and 134d as an etching mask. Next, the third, fourth, fifth and sixth PR patterns 134a, 134b, 134c and 134d are removed.

Figure 11H:
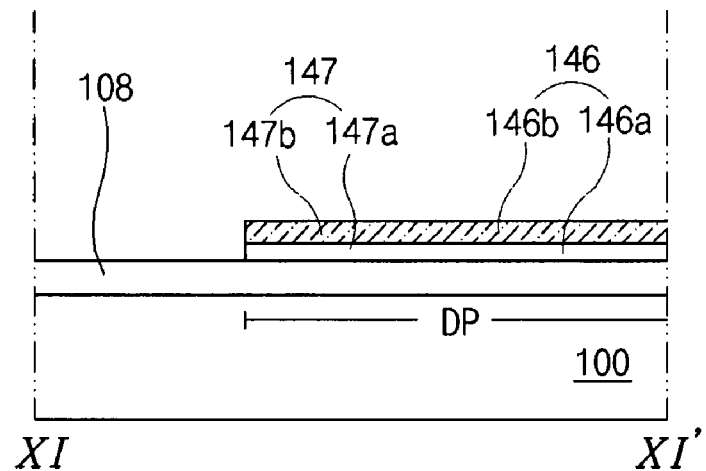

As shown in FIGS. 9H, 10H and 11H, source and drain electrodes 136 and 138 are formed in the switching region S, and a pixel pattern 139 is formed in the pixel region P. In addition, a gate pad terminal pattern 141 contacting the gate pad 106 is formed in the gate pad region GP, and a data line 146 and a data pad pattern 147 at one end of the data line 146 are formed on the first insulating layer 108. Each of the source electrode 136, the drain electrode 138, the pixel pattern 139, the gate pad terminal pattern 141, the data line 146 and the data pad pattern 147 includes a first metal layer of a transparent conductive material and a second metal layer of an opaque conductive material. For example, the source electrode 136 includes a first source metal layer 136a and a second source metal layer 136b, and the drain electrode 138 includes a first drain metal layer 138a and a second drain metal layer 138b. The pixel pattern 139 includes a first pixel metal layer 139a and a second pixel metal layer 139b, and the gate pad terminal pattern 141 includes a first gate pad terminal metal layer 141a and a second gate pad terminal metal layer 141b. In addition, the data line 146 includes a first data metal layer 146a and a second data metal layer 146b, and the data pad pattern 147 includes a first data pad metal layer 147a and a second data pad metal layer 147b.

Figure 9I:
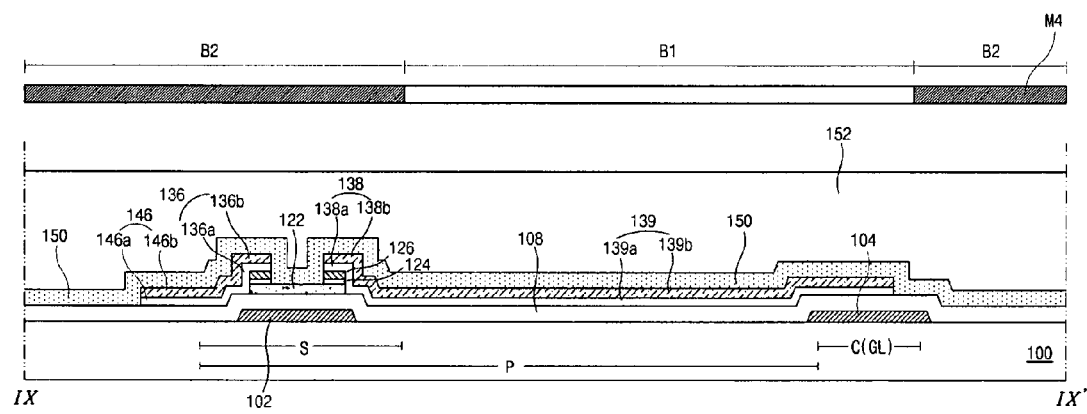

The buffer metal pattern 126a and the ohmic contact pattern 124a are patterned using the source and drain electrodes 136 and 138 as an etching mask to form a buffer metal layer 126 (of FIG. 9I) and an ohmic contact layer 124 (of FIG. 9I). As a result, the active layer 122 is exposed through the buffer metal layer 126 and the ohmic contact layer 124. The buffer metal pattern 126a and the ohmic contact pattern 124a may be selectively patterned with an etching condition such that the source electrode 136, the drain electrode 138, the pixel pattern 139, the gate pad terminal pattern 141, the data line 146 and the data pad pattern 147 are not etched.

Figure 9J:
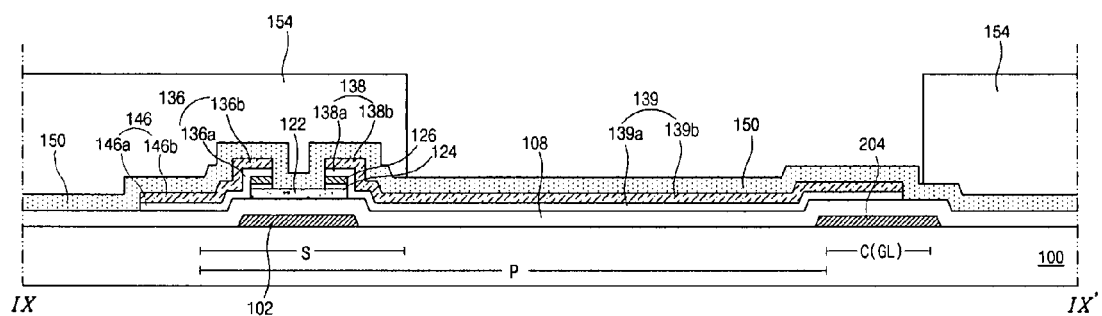
Figure 9K:
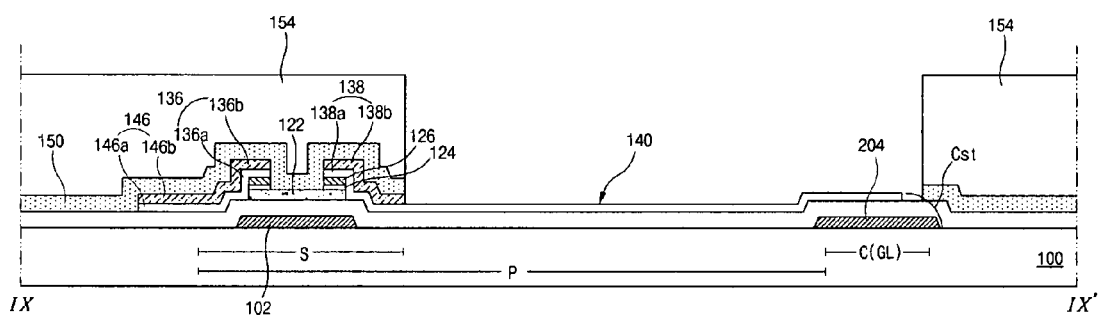
Figure 9L:
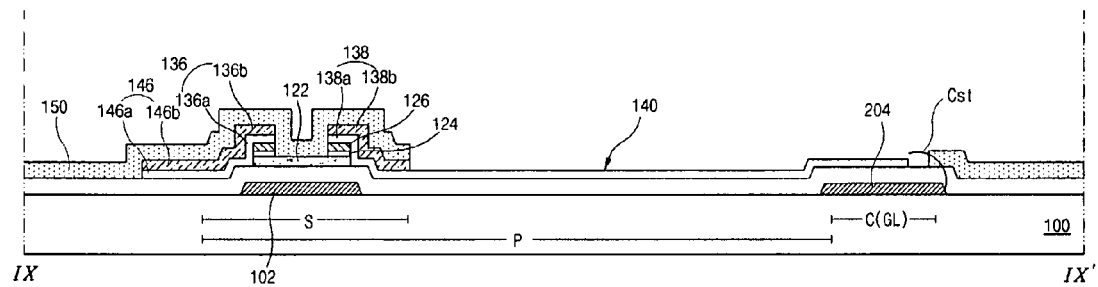
Figure 10I:
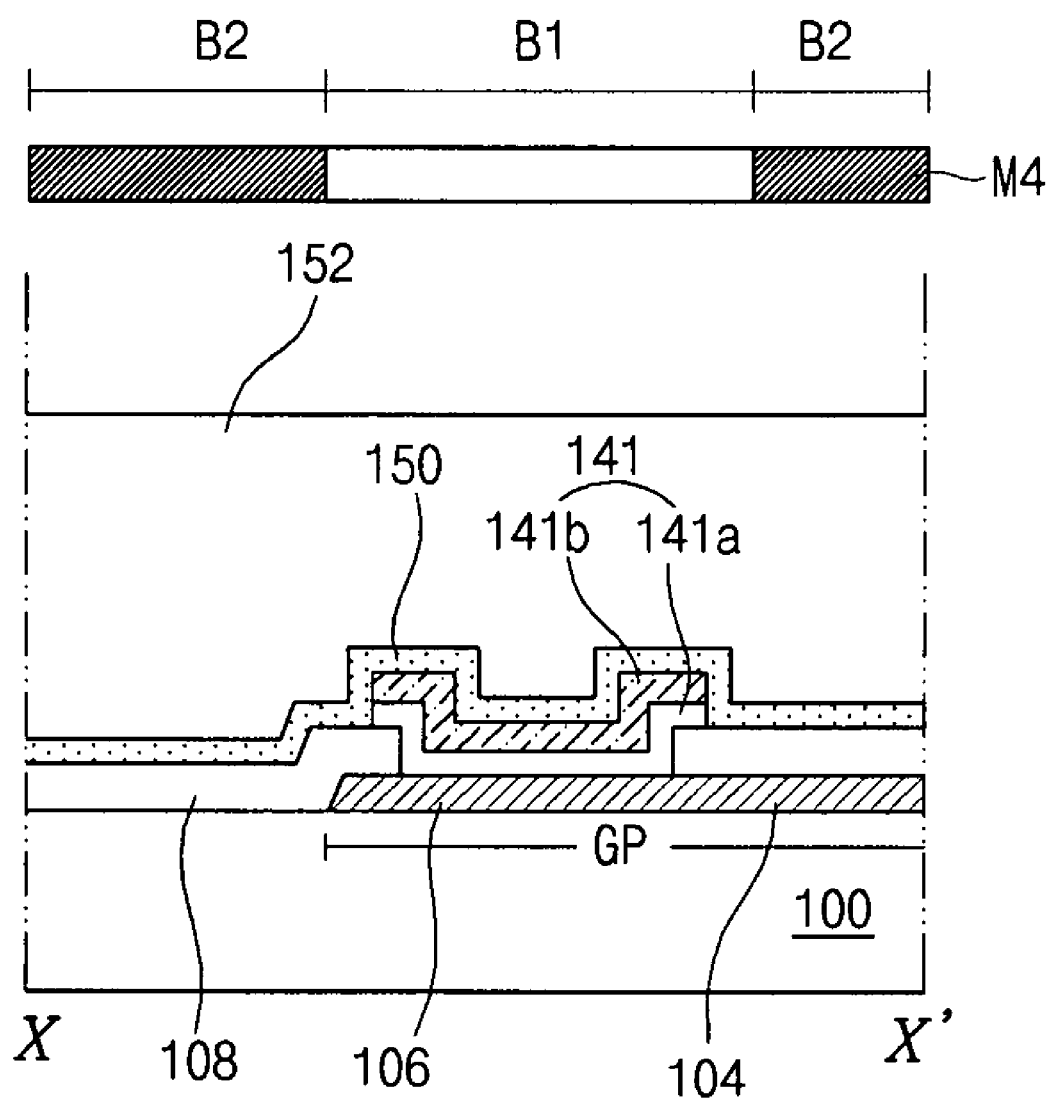
Figure 10J:
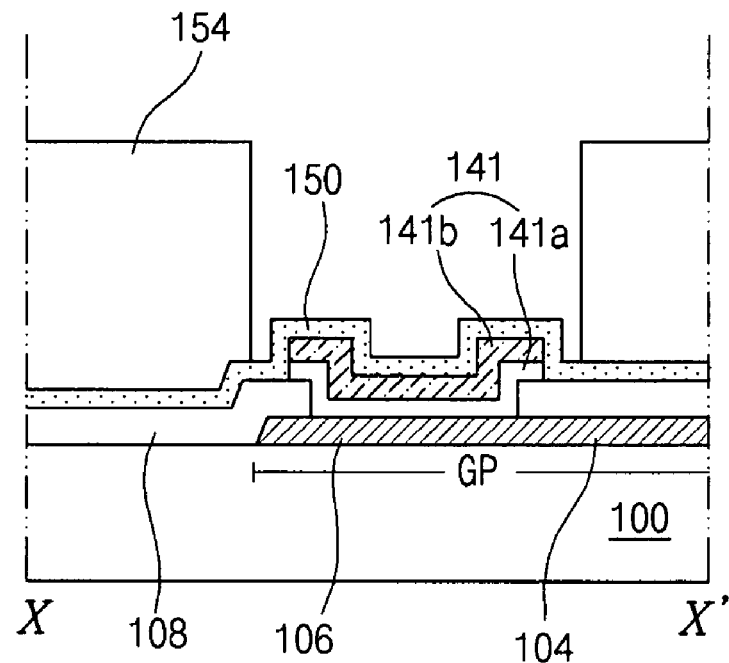
Figure 10K:
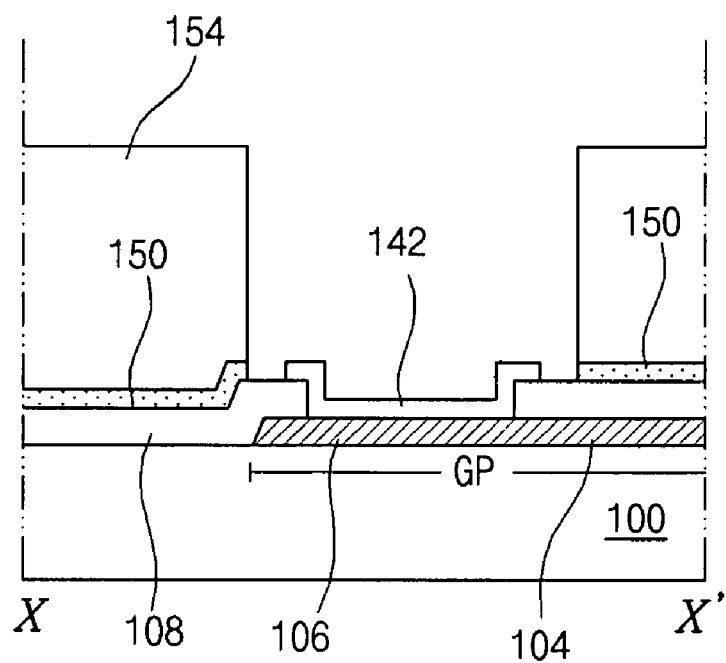
Figure 10L:
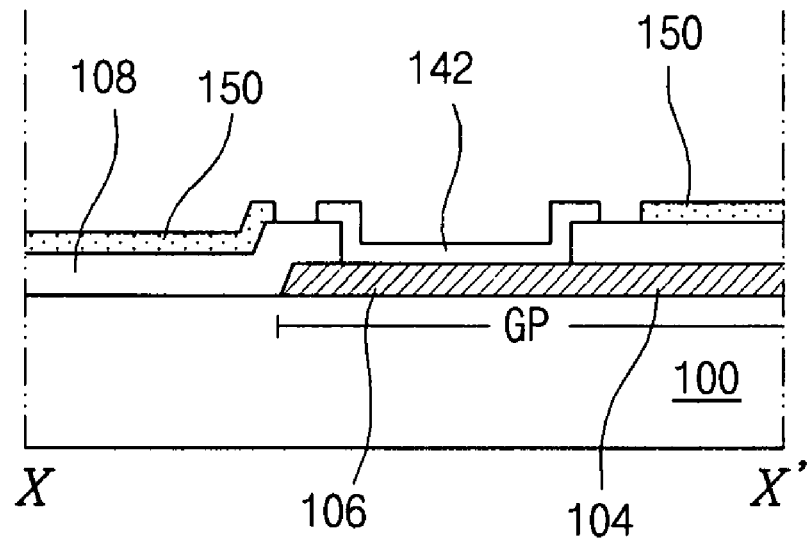
Figure 11I:
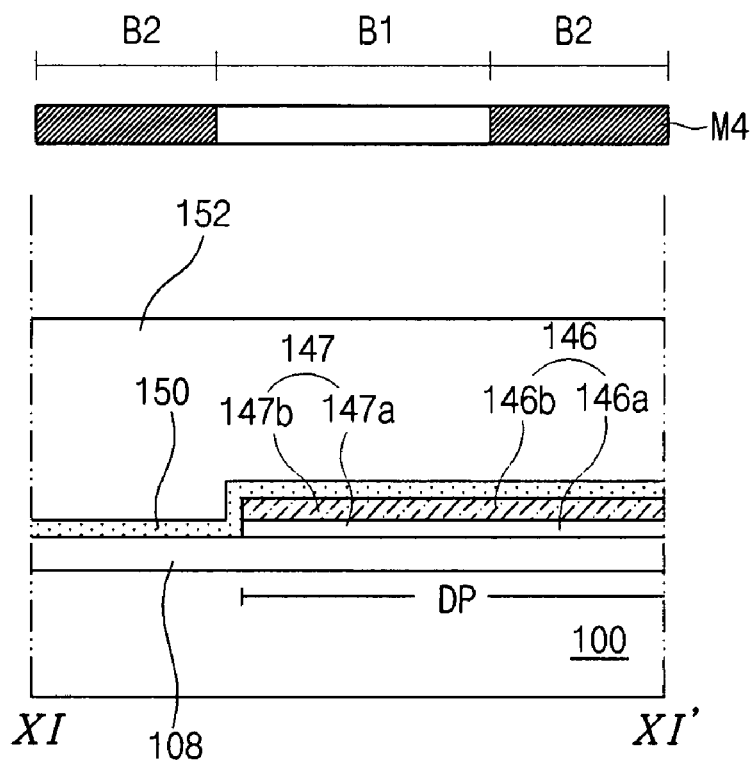

FIGS. 9I to 9L, 10I to 10L and 11I to 11L show a fourth mask process. In FIGS. 9I, 10I and 11I, the buffer metal layer 126 is formed between the ohmic contact layer 124 and the first source metal layer 136a and between the ohmic contact layer 124 and the first drain metal layer 138a to reduce a contact resistance or to obtain an ohmic contact between the ohmic contact layer 124 and the source and drain electrodes 136 and 138. In another embodiment, however, the contact resistance may be reduced or the ohmic contact may be obtained without using the buffer metal layer.

A second insulating layer 150 is formed on the substrate 100. The second insulating layer 150 includes an inorganic insulating material such as silicon nitride (SiNx) and silicon oxide ($SiO_2$). A third PR layer 152 is formed on the second insulating layer 150, and a fourth mask M4 having a transmitting portion B1 and a blocking portion B2 is disposed over the third PR layer 152. The blocking portion B2 corresponds to the switching region, and the transmitting portion B1 corresponds to the gate pad 106, the data pad pattern 147 and the pixel pattern 139. The third PR layer 152 is exposed to light through the third mask M3 and then the exposed third PR layer 152 is developed.

Figure 11J:
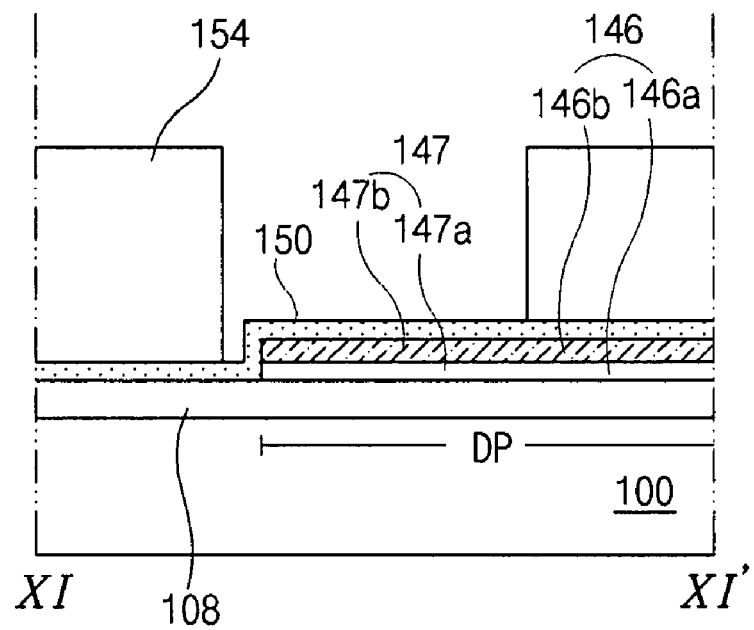

In FIGS. 9J, 10J and 11J, a seventh PR pattern 154 is formed on the second insulating layer 150. The second insulating layer 150 corresponding to the pixel pattern 139, the gate pad terminal pattern 141 and the data pad pattern 147 is exposed through the seventh PR pattern 154. Next, the second insulating layer 150, the pixel pattern 139, the gate pad terminal pattern 141 and the data pad pattern 147 are patterned using the seventh PR pattern 154 as an etching mask. Accordingly, after the second insulating layer 150 is patterned, the second pixel metal layer 139b of the pixel pattern 139, the second gate pad terminal metal layer 141b of the gate pad terminal pattern 141 and the second data pad metal layer 147b of the data pad pattern 147 are concurrently patterned. For example, the second insulating layer 150 may be etched using a dry etching method, and each of the second pixel metal layer 139b, the second gate pad terminal metal layer 141b and the second data pad metal layer 147b having the opaque conductive material may be etched using a wet etching method.

Figure 11K:
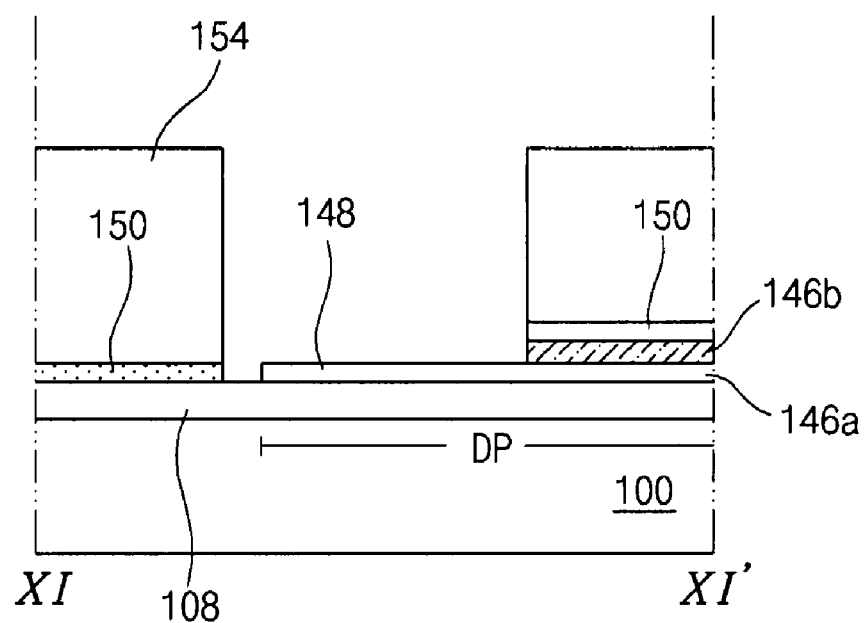

In FIGS. 9K, 10K and 11K, the first pixel metal layer 139a (of FIG. 9J) having the transparent conductive material remains in the pixel region P to become a pixel electrode 140 of a single transparent conductive material layer. The first gate pad terminal metal layer 141a (of FIG. 10J) remains in the gate pad region GP to become a gate pad terminal 142 of a single transparent conductive material layer, and the first data pad metal layer 147a (of FIG. 11J) remains in the data pad region DP to become a data pad 148 of a single transparent conductive material layer. Next, the seventh PR pattern 154 is removed.

Figure 11L:
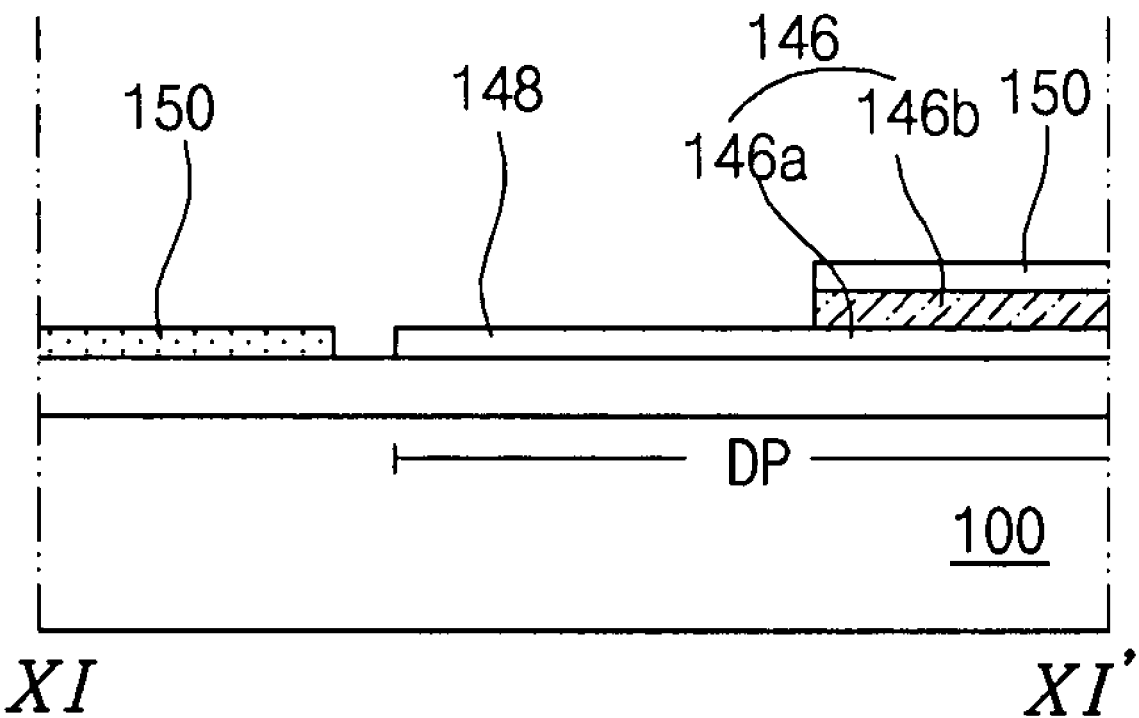

In FIGS. 9L, 10L and 11L, a thin film transistor (TFT) T including the gate electrode 102, the first insulating layer 120, the active layer 122, the ohmic contact layer 124, the buffer metal layer 126, the source electrode 136 and the drain electrode 138 is formed in the switching region S. Each of the source and drain electrodes 136 and 138 includes a double layer of a first layer of a transparent conductive material and a second layer of an opaque conductive material. The pixel electrode 140 in the pixel region P includes a single layer of the transparent conductive material and extends from the first drain metal layer 138a of the drain electrode 138. The gate pad terminal 142 in the gate pad region GP includes a single layer of the transparent conductive material and contacts the gate pad 106. The data pad 148 in the data pad region DP includes a single layer of the transparent conductive material and extends from the first data metal layer 146a of the data line 146. In addition, the pixel electrode 140 extends and overlaps the gate line 104 to constitute a storage capacitor Cst having the overlapped portion of the gate line 104 as a first capacitor electrode, the overlapped portion of the pixel electrode 140 as a second capacitor electrode and the first insulating layer 120 between the first and second capacitor electrode as a dielectric material.

An array substrate for an LCD device according to the present invention, where a semiconductor layer is not formed under a data line, is fabricated through the above four mask process. The four mask process of fabricating an array substrate for an LCD device according to embodiments of the present invention may include: a first mask process of forming a gate electrode on a substrate, a gate line connected to the gate electrode and a gate pad at one end of the gate line; a second mask process of forming a first insulating layer exposing the gate pad, an active layer on the first insulating layer, an ohmic contact pattern on the active layer and a buffer metal pattern on the ohmic contact pattern; a third mask process of forming source and drain electrodes on the buffer metal pattern, a pixel pattern extending from the drain electrode, a gate pad terminal pattern contacting the gate pad, a data line extending from the source electrode and a data pad pattern at one end of the data line with a transparent conductive material layer and an opaque conductive material layer, and patterning the buffer metal pattern and the ohmic contact pattern to form a buffer metal layer and an ohmic contact layer; a fourth mask process of forming a second insulating layer on an entire surface of the substrate and patterning the pixel pattern, the gate pad terminal pattern and the data pad pattern to form a pixel electrode, a gate pad terminal and a data pad of the transparent material layer.

Consequently, in an array substrate for an LCD device according to embodiments of the present invention, since a semiconductor layer is not formed under a data line, wavy noise is prevented and aperture ratio is improved. In addition, since an active layer having an island shape is formed within a gate electrode, a light leakage current is prevented and a property of a thin film transistor is improved. Further, since a pixel electrode extends from a drain electrode without a contact hole, aperture ratio is further improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An array Substrate for a liquid crystal display device, comprising:
    a gate line and a data line crossing each other on a Substrate to define a pixel region;
    an insulating layer between the gate line and the data line;
    a gate electrode extending from the gate line;
    a transistor in the pixel region having an active layer on the insulating layer, an ohmic contact layer on the active layer, a source electrode and a drain electrode on the ohmic contact layer; and
    a pixel electrode connected to the transistor,
    a passivation layer covering the source and drain electrodes and exposing the pixel electrode, wherein the passivation layer has an edge that substantially coincides with an edge of the drain electrode,
    wherein the active layer is in an island shape over the gate electrode and within a boundary defined by a perimeter of the gate electrode,
    wherein each of the source and drain electrodes includes a transparent conductive layer and a metallic material layer on the transparent conductive layer,
    wherein the transparent conductive metallic layer is formed on the insulating layer, and the metallic material layer is formed on the transparent conductive layer, and
    wherein the pixel electrode extends from and has the same layer as the transparent conductive layer of the drain electrode.

2. The array substrate according to claim 1, wherein at least one of the source and drain electrodes is in contact with the active layer.

3. The array substrate according to claim 1, wherein at least one of the source and drain electrodes is in contact with the insulating layer.

4. The array substrate according to claim 1, wherein at least one of the source and drain electrodes is in contact with one of the ohmic contact layers.

5. The array substrate according to claim 1, further comprising:
    a gate pad at an end of the gate line; and
    a transparent gate pad terminal on the gate pad.

6. The array substrate according to claim 1, further comprising a data pad at one end of the data line and including a transparent conductive material.

7. The array substrate according to claim 1, further comprising, a pixel electrode extends from drain electrode and overlaps the gate line to constitute a storage capacitor having an overlapped portion of the gate line as a first capacitor electrode and an overlapped portion of the pixel electrode as a second capacitor electrode.

8. An array substrate for a liquid crystal display device, comprising:
    a gate line and a data line crossing each other on a substrate to define a pixel region;
    an insulating layer between the gate line and the data line;
    a transistor in the pixel region having an active layer on the insulating layer and ohmic contact layers of a first material that are adjacent to ends of the active layer;
    a pixel electrode connected to the transistor; and
    source and drain electrodes each having a transparent conductive layer and an opaque layer on the transparent conductive layer for connecting to the ohmic contact layers,
    a passivation layer covering the source and drain electrodes and exposing the pixel electrode, wherein the passivation layer has an edge that substantially coincides with an edge of the drain electrode,
    wherein the transparent layer is formed on the insulating layer, and the opaque layer is formed on the transparent conductive layer,
    wherein the active layer is in an island shape over the gate electrode and within a boundary defined by a perimeter of the gate electrode, and
    wherein the pixel electrode extends from and has the same layer as the transparent conductive layer of the drain electrode.

9. The array substrate according to claim 8, wherein the transparent conductive layer of at least one of the source and drain electrodes is in contact with the active layer.

10. The array substrate according to claim 8, wherein the transparent conductive layer of at least one of the source and drain electrodes is in contact with the insulating layers.

11. The array substrate according to claim 8, wherein the transparent conductive layer of at least one of the source and drain electrodes is in contact with one of the ohmic contact layers.

12. The array substrate according to claim 8, further comprising:
a gate pad at an end of the gate line; and
a transparent gate pad terminal on the gate pad.

13. The array substrate according to claim 8, further comprising a data pad at one end of the data line and including a transparent conductive material.

14. The array substrate according to claim 8, further comprising, a pixel electrode extends from drain electrode and overlaps the gate line to constitute a storage capacitor having an overlapped portion of the gate line as a first capacitor electrode and an overlapped portion of the pixel electrode as a second capacitor electrode.

15. The array substrate according to claim 8, wherein the first material is semiconductive.

16. The array substrate according to claim 8, wherein buffer layers are formed between the ohmic contact layers and the source and drain electrodes.

17. The array substrate according to claim 1, further comprising buffer metal layers between the ohmic contact layer and the source electrode and between the ohmic contact layer and the drain electrode.

18. The array substrate according to claim 17, wherein the metallic material layer includes one or more selected from metallic conductive material group including aluminum (Al), aluminum (Al) alloy, chromium (Cr), molybdenum (Mo), tungsten (W), titanium (Ti), copper (Cu), copper (Cu) alloy and tantalum (Ta).

* * * * *